United States Patent
Matsumoto

(10) Patent No.: US 6,466,502 B1
(45) Date of Patent: Oct. 15, 2002

(54) SEMICONDUCTOR MEMORY DEVICE HAVING SWITCHING AND MEMORY CELL TRANSISTORS WITH THE MEMORY CELL HAVING THE LOWER THRESHOLD VOLTAGE

(75) Inventor: Shoichiro Matsumoto, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/537,804

(22) Filed: Mar. 24, 2000

(30) Foreign Application Priority Data

Mar. 25, 1999 (JP) ............................................ 11-081807

(51) Int. Cl.[7] ............................................... G11C 7/02
(52) U.S. Cl. .................... 365/208; 365/63; 365/189.09; 365/230.03
(58) Field of Search ................ 365/230.06, 63, 365/51, 230.03, 190, 205, 207, 208, 149, 52, 189.09, 189.11, 226

(56) References Cited

U.S. PATENT DOCUMENTS

| 5,128,896 A | 7/1992 | Yamada et al. ......... 365/189.01 |
| 5,323,350 A | 6/1994 | McLaury .................... 365/208 |
| 5,594,695 A | 1/1997 | Yim et al. ................... 365/205 |
| 5,602,793 A | 2/1997 | Tomishima et al. ......... 365/226 |
| 5,617,369 A | 4/1997 | Tomishima et al. |
| 5,636,175 A | 6/1997 | McLaury ................ 365/230.06 |
| 5,650,976 A | 7/1997 | McLaury ................ 365/230.06 |
| 5,726,590 A | 3/1998 | Isono ........................... 326/86 |
| 5,745,423 A | 4/1998 | Tai .............................. 365/203 |
| 5,774,408 A | 6/1998 | Shirley ................... 365/230.03 |
| 5,808,951 A | 9/1998 | Shimohigashi et al. ..... 365/205 |
| 5,870,339 A | 2/1999 | Oowaki et al. ......... 365/189.09 |
| 6,046,924 A * | 4/2000 | Isobe et al. .................... 365/51 |

FOREIGN PATENT DOCUMENTS

| EP | 0 559 995 A1 | 9/1993 |
| JP | 6-162779 | 6/1994 |
| JP | 8-297972 | 11/1996 |
| JP | 10-134570 | 5/1998 |
| JP | 10-241361 | 9/1998 |

\* cited by examiner

Primary Examiner—Huan Hoang
Assistant Examiner—Gene N. Auduong
(74) Attorney, Agent, or Firm—Armstrong, Westerman & Hattori, LLP

(57) ABSTRACT

A switching transistor to connect a pair of bit lines in a sub array to a pair of common bit lines in a sense amplifier band is arranged between a P channel sense amplifier and an N channel sense amplifier. Accordingly, the switching transistor can be used of a threshold value identical to that of the NMOSFET used in a logic circuit region, not a low threshold value. Therefore, the switching transistor can be reliably turned on/off in a narrow operating range. Accordingly, the complexity or capability of the drive circuit can be suppressed to a low level. As a result, the area for the semiconductor memory device can be reduced.

3 Claims, 16 Drawing Sheets

"1" Write

"0" Write

Data Hold

SEMICONDUCTOR MEMORY DEVICE HAVING SWITCHING AND MEMORY CELL TRANSISTORS WITH THE MEMORY CELL HAVING THE LOWER THRESHOLD VOLTAGE

BACKGROUND OF THE INVENTION

1. Field of the Invention

The present invention relates to a semiconductor memory device such as a dynamic RAM (Random Access Memory) suitable for integration on a semiconductor substrate together with a logic circuit.

2. Description of the Background Art

Conventionally, logic circuits and dynamic RAMs (DRAM) of microprocessors and application specific integrated circuits (ASIC) have been produced as large scale integrated circuits (VLSI, ULSI, and the like) of high performance in accordance with increase of the integration density. These integrated circuits are produced respectively as individual chips, and connected to an external line on a system board in systems of personal computers.

It has become difficult to improve the high performance of the computer in such systems since the computing ability of the computer is restricted by the parasitic capacitance and resistance of the external wiring. Recently, an approach of improving the high performance has been effected by forming the logic circuit and the DRAM on the same semiconductor substrate.

Particularly, providing the metal wiring of the logic circuit in multilayers has been implemented. Development of multilayer metal wiring such as six or seven layers is in progress.

FIGS. 1A to 3B schematically show a fabrication process of a conventional semiconductor memory device having a DRAM formed of two metal interconnection layers and a logic circuit utilizing this DRAM embedded on the same semiconductor substrate. FIGS. 1A–3A correspond to the partial sectional views of the DRAM region whereas FIGS. 1B–3B correspond to the partial cross sectional views of the logic circuit region.

As shown in FIGS. 1A and 1B, following the formation of a field oxide film 2 for element isolation on an Si (silicon) substrate 1, a gate oxide film 3, a gate electrode 4 of a transistor of polycrystalline silicon, a word line (gate line) 4a, a silicon oxide film 5 thereon, and diffusion layers 6 and 6a are formed. An interlayer insulation film 217 is formed thereon by CVD. Then, an opening is formed at a portion of interlayer insulation film 217 for capacitor formation by a photoresist process and dry etching process.

As to the DRAM region, the process of thin film deposition, photoresist and dry etching is repeated to sequentially form a storage electrode 201 of the memory cell capacitor shown in FIG. 2A, a capacitor insulating film 202, and a cell plate electrode 203. Then, an interlayer insulating film 204 is formed thereon including the logic circuit region.

As to the same DRAM region, the above wiring and interlayer insulating film are deposited alternately and processed to form a bit line 206 constituted by a polycrystalline silicon film and a tungsten polycide film, and a contact hole 205 connecting bit line 206 with diffusion layer 6a. Then, an interlayer insulating film 207 is formed thereon including the logic circuit region.

In the above semiconductor memory device having a DRAM region and a logic circuit region embedded, a memory cell is formed of a memory cell transistor for address selection and a memory cell capacitor for data storage. The data storage operation is effected by storing charge in the memory cell capacitor. The amount of stored charge must be increased in order to read out data properly and speedily, and in order to lengthen the data retaining time.

The amount of charge stored in the memory cell capacitor of a DRAM is proportional to the voltage written into the memory cell. The write voltage of H (logical high) data is represented as below.

$$\text{write voltage} = \{\alpha Vcc - (Vtn+\beta)\cdot\gamma\} \quad (1)$$

Here, $\alpha$: time function depending upon the time constant by the parasitic capacitance and resistance from the power supply voltage source up to the memory cell ($\alpha \leq 1$)

$\beta$: increase in threshold value depending upon back bias value $\gamma$: coefficient depending upon write characteristics and operating cycle ($\gamma \leq 1$)

Vcc: power supply voltage

Vtn: threshold of memory cell transistor

In such a DRAM, the write voltage can be increased by minimizing the second term (Vtn+$\beta$) of equation (1). In general, the voltage of the word line is set higher than power supply voltage Vcc to cancel the minus of the second term.

In the case where the DRAM region and the logic circuit region are mounted together, it is desirable to form respective gate oxide films 3 of the logic circuit region and the DRAM region by the same step to simplify the oxide film formation step, as shown in FIGS. 1A to 3B. In this case, the thickness of respective gate oxide films 3 of the logic circuit region and the DRAM region becomes identical. From the standpoint of high speed, gate oxide film 3 of the logic circuit region is set relatively thin, so that gate oxide film 3 of the DRAM region is inevitably also thin. As a result, the voltage on the word line cannot be boosted since it is necessary to ensure the reliability of gate oxide film 3 of the DRAM region. This induces the problem that it is difficult to increase the write voltage, i.e. the amount of stored charge.

As an approach to solve this problem, Japanese Patent Laying-Open No. 10-134570 discloses the usage of a transistor having a threshold value lower than that of the general one (approximately 0.6 V) for the memory cell. Accordingly, the second term of the aforementioned equation (1) can be reduced.

In this conventional art, the so-called shared sense amplifier system is employed. The sense amplifier is connected via the switching transistors disposed at both sides to the bit line pair arranged at both sides of the switching transistors. Accordingly, a write voltage is applied to the memory cell capacitor through a switching transistor and a memory cell transistor. In circuitry of such a structure, the voltage applied to the memory cell capacitor depends upon the threshold values of both the switching transistor and the memory cell transistor, and will be reduced by the threshold value of either of the two transistors that has the greater threshold value. When a memory cell transistor that has a low threshold value is employed, the threshold value of the switching transistor must also be of a similar low level.

However, reduction in the threshold value of the switching transistor necessitates the usage of a negative voltage Vbb as the voltage to reliably turn the transistor off. As a result, a circuit that drives in a wide operating range is required, causing the problem of a larger layout area. Furthermore, there is a problem that the load of the Vbb generation circuit becomes heavier to increase the circuit complexity and power consumption.

SUMMARY OF THE INVENTION

An object of the present invention is to provide a semiconductor memory device that has the write voltage of a memory cell capacitor increased.

According to an aspect of the present invention, a semiconductor memory device includes a first switching transistor for connecting a bit line extending from a memory sub array having a memory cell transistor to a first sense amplifier. The first switching transistor is arranged at a side opposite to the memory sub array than the input side of the sense amplifier.

In the semiconductor memory device of this aspect, the first sense amplifier includes a first P channel sense amplifier and an N channel sense amplifier. The first switching transistor is arranged between the first P channel sense amplifier and N channel sense amplifier to effect isolation and connection therebetween.

According to another aspect of the present invention, a semiconductor memory device includes a first common bit line, a second common bit line, an N channel sense amplifier, a first bit line, a second bit line, a first P channel sense amplifier, a first switching transistor, a second switching transistor, a third bit line, a fourth bit line, a second P channel sense amplifier, a third switching transistor, a fourth switching transistor, a word line, a memory cell capacitor, and a memory cell transistor. The second common bit line is complementary to the first common bit line. The N channel sense amplifier is connected between the first and second common bit lines. The second bit line is complementary to the first bit line. The first P channel sense amplifier is connected between the first and second bit lines. The first switching transistor is connected between the first common bit line and the first bit line. The second switching transistor is connected between the second common bit line and the second bit line. The fourth bit line is complementary to the third bit line. The second P channel sense amplifier is connected between the third and fourth bit lines. The third switching transistor is connected between the first common bit line and the third bit line. The fourth switching transistor is connected between the second common bit line and the fourth bit line. The memory cell transistor has a gate connected between the first bit line and the memory cell capacitor, and connected to a word line.

In this semiconductor memory device, the first P channel sense amplifier amplifies directly the voltage of the first or second bit line to the power supply voltage without the involvement of the first or second switching transistor. Therefore, the write voltage of the memory cell capacitor is increased to allow a larger storage capacity for the memory cell.

Preferably, the memory cell transistor has a threshold value lower than the threshold value of the first switching transistor. Accordingly, the storage capacity of the memory cell is further increased.

Preferably, the semiconductor memory device further includes an N channel drive transistor connected between a power supply node and the first P channel sense amplifier. Accordingly, the first P channel sense amplifier can apply a voltage lower than the power supply voltage by the threshold voltage of the N channel drive transistor to the first or second bit line.

According to another aspect of the present invention, a semiconductor memory device includes a semiconductor substrate, a dynamic random access memory formed on the semiconductor substrate, and a logic circuit formed on the semiconductor substrate to control the dynamic random access memory. A memory cell capacitor in the dynamic random access memory includes a capacitor insulating film of a thickness substantially identical to that of the gate insulating film of the transistor that forms the logic circuit. Accordingly, the capacitor insulating film of the memory cell capacitor can be formed in a step identical to that of the gate insulating film of the transistor that forms the logic circuit.

Preferably, the memory cell capacitor includes a cell plate electrode connected to ground. Therefore, a circuit to generate a cell plate voltage is not required.

According to a further aspect of the present invention, a semiconductor memory device includes a power supply line, a ground line, and a plurality of memory cell arrays. Each memory cell array includes a sub array having a plurality of bit line pairs, and a sense amplifier band adjacent to the sub array. The sense amplifier band includes a plurality of P channel sense amplifiers, a plurality of power supply drive transistors, a plurality of N channel sense amplifiers, and a plurality of ground drive transistors. The plurality of P channel sense amplifiers are connected to the plurality of bit line pairs, respectively. The plurality of power supply drive transistors are provided corresponding to the plurality of P channel sense amplifiers. Each power supply drive transistor is connected between the power supply line and a corresponding P channel sense amplifier. The plurality of N channel sense amplifiers are connected to the plurality of bit line pairs, respectively. The plurality of ground drive transistors are provided corresponding to the plurality of N channel sense amplifiers. Each ground drive transistor is connected between the ground line and a corresponding N channel sense amplifier.

The semiconductor memory device is advantageous in that the storage capacity can be easily increased by just designing repeatedly a memory cell array of the same structure.

According to still another aspect of the present invention, a semiconductor memory device includes a word line driver connected to a select signal line corresponding to a word line, and respectively supplying a voltage of the select signal line to a word line, a row address detection circuit responsive to a row address signal to selectively render the word line driver active, and a control circuit responsive to the row address signal to selectively supply a ground voltage or a negative voltage to the select signal line.

According to still another aspect of the present invention, a semiconductor memory device includes a plurality of word line drivers, a row address detection circuit and a control circuit. Each word line driver is connected to a plurality of word lines and a plurality of select signal lines corresponding to the plurality of word lines to supply the voltage on the plurality of select signal lines to the plurality of word lines, respectively. The row address detection circuit responds to a row address signal to selectively render the plurality of word line drivers active. The control circuit responds to a row address signal to selectively supply a ground voltage or a negative voltage to the plurality of select signal lines.

In this semiconductor memory device, a ground voltage or negative voltage is supply from the control circuit to a word line driver, whereby a word line is driven to the level of ground voltage or negative voltage. Therefore, power consumption of the circuit to generate a negative voltage can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
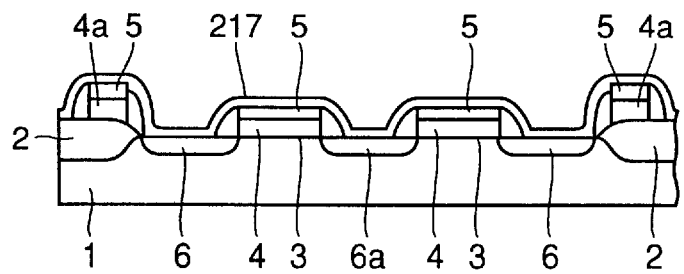
FIGS. 1A to 3B are sectional views of a conventional semiconductor memory device showing a fabrication process thereof.

An embodiment of a semiconductor memory device according to the present invention will be described hereinafter with reference to the drawings. In the drawings, the same or corresponding components have the same reference characters allotted, and description thereof will not be repeated.

Figure 4A:
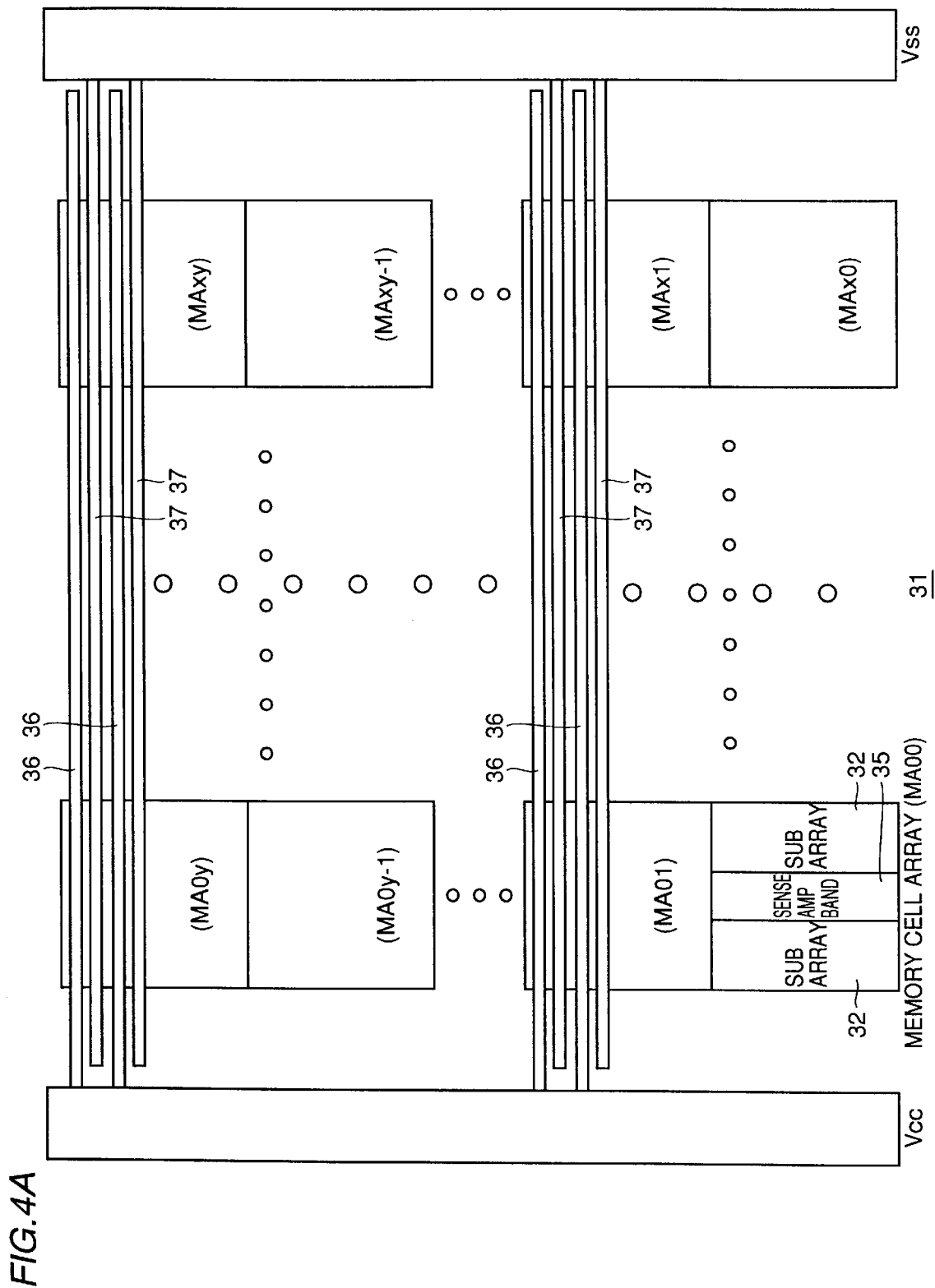
FIG. 4A is a plan view of the layout of a semiconductor memory device according to an embodiment of the present invention.

FIG. 4A is a plan view showing the layout of a semiconductor memory device 31 according to an embodiment of the present invention. Referring to FIG. 4A, semiconductor memory device 31 includes a global power supply line Vcc, a plurality of local power supply lines 36, a global ground line Vss, a plurality of local ground lines 37, and a plurality of memory cell arrays MA00–MAxy. Global power supply line Vcc and global ground line Vss are formed of aluminum alloy, arranged at both sides of a semiconductor chip. Local power supply line 36 is also formed of aluminum alloy, orthogonal and connected to global power supply line Vcc. Local ground line 37 is also formed of aluminum alloy, orthogonal and connected to global ground line Vss. Local power supply line 36 and local ground line 37 are arranged alternately. Memory cell arrays MA00–MAxy are arranged in a matrix. Each of memory cell arrays MA00–MAxy includes two sub arrays 32, and a sense amplifier band 35. Sense amplifier band 35 is arranged at the center of the memory cell array. Sub array 32 is arranged adjacent to both sides of sense amplifier band 35.

Figure 4B:
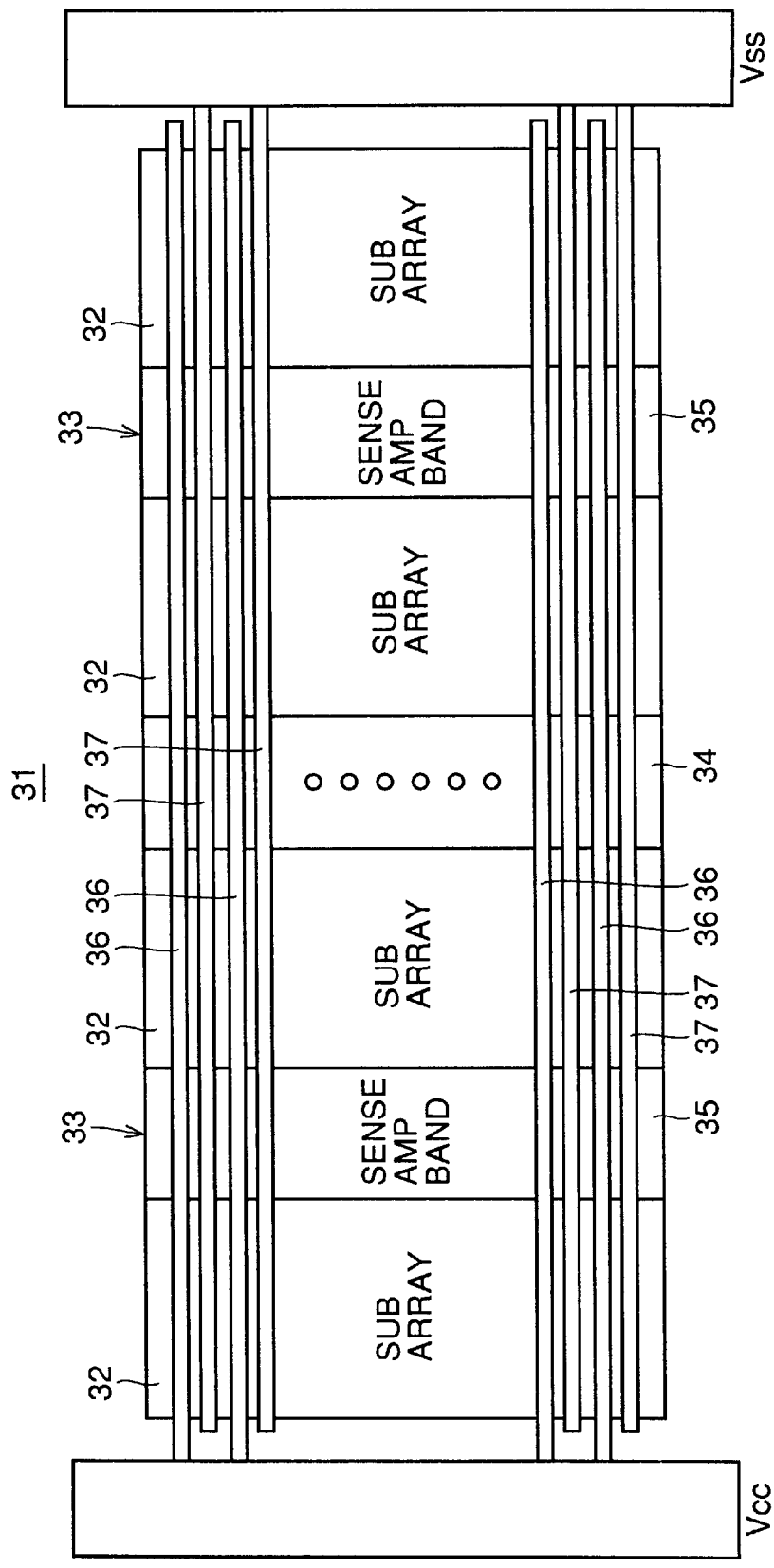
FIG. 4B is a partial plan view of the semiconductor memory device of FIG. 4A.

In semiconductor memory device 31 of FIG. 4B, only two memory cell arrays 33 are shown. Therefore, only four sub arrays 32 are shown. Each sub array 32 has the storage capacity of, for example, 64 Kbits.

A column decoder 34 is arranged between memory cell arrays 33 and 33. Sense amplifier band 35 taking the structure of the shared sense amplifier system has a bit line pair provided left to and right to sense amplifier band 35. Each sub array 32 is selectively connected to the bit line pair of either the left or right side. Sense amplifier band 35 that will be described afterwards includes a sense amplifier, a precharge circuit, and an input/output (I/O) line.

Local power supply line 36 and local ground line 37 are formed on memory cell array 33 with an interlayer insulating film thereunder, and connected to global power supply line Vcc and global ground line Vss through a contact hole formed at a predetermined position in the interlayer insulating film. Since a plurality of local power supply lines 36 and local ground lines 37 must be provided on a limited layout area, the width of local power supply and ground lines 36 and 37 is smaller than that of global power supply line Vcc and global ground line Vss.

Figure 5:
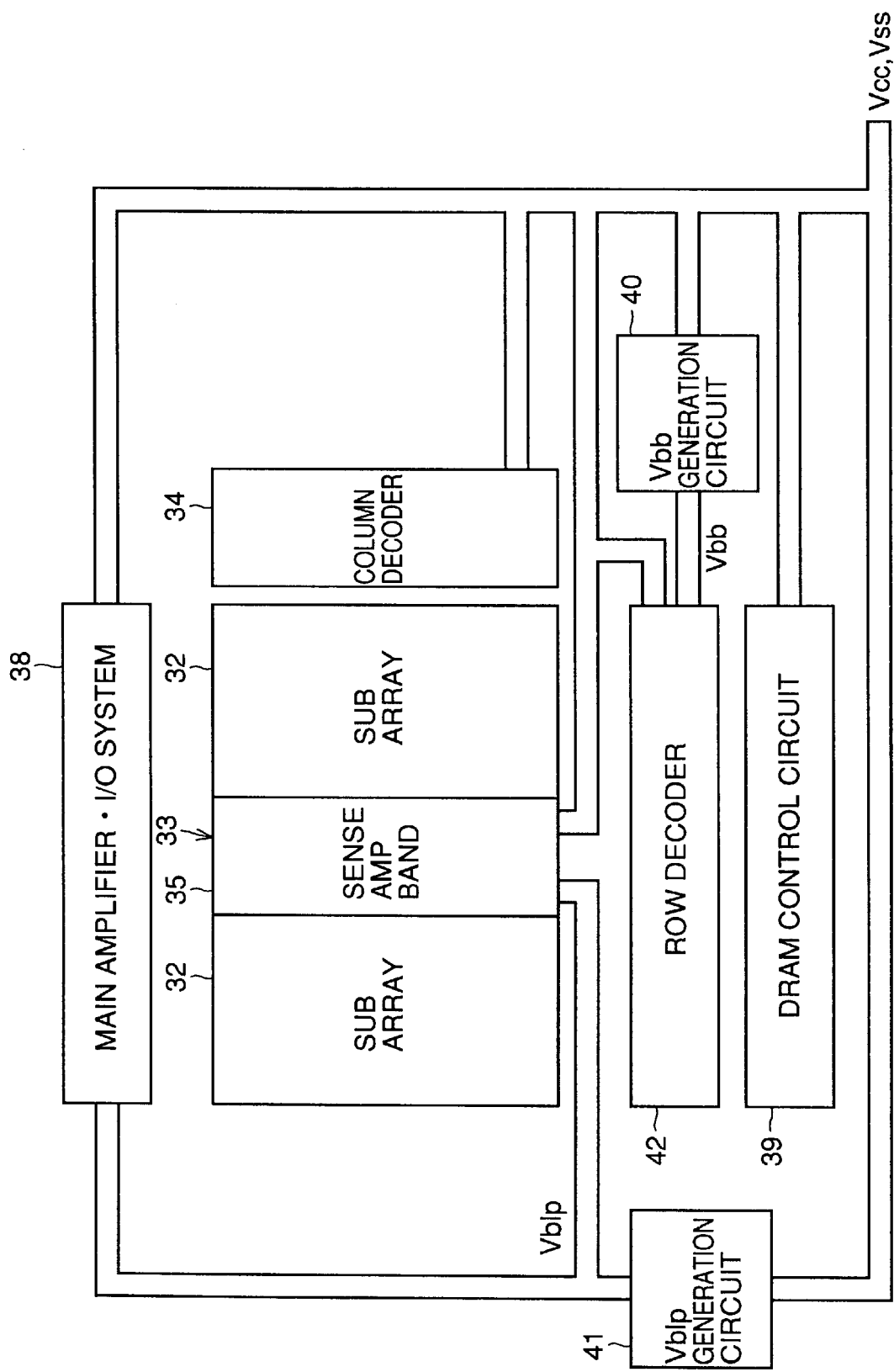
FIG. 5 is a block diagram showing a circuit structure of the semiconductor memory device of FIG. 4A.

FIG. 5 shows a control block diagram of semiconductor memory device 31. For the sake of simplification, only one memory cell array 33 is depicted. Power supply voltage Vcc and ground voltage Vss supplied from local power supply line 36 and local ground line 37, respectively, are applied to a column decoder 34, a main amplifier·I/O system 38, a DRAM control circuit 39, a Vbb generation circuit 40, a Vblp generation circuit 41 and a row decoder 42.

Vbb generation circuit 40 is formed of an oscillation circuit such as a ring oscillator and a charge pump circuit that produces a negative voltage by the oscillating pulse to receive voltages Vcc and Vss to generate the well-known substrate back bias voltage Vbb. Vbb generation circuit 40 of the present embodiment receives ground voltage Vss to generate a negative voltage Vbb lower than ground voltage Vss by the threshold voltage Vtn (approximately 0.4–0.5 V) of the memory cell transistor.

Vblp generation circuit 41 generates a precharge voltage Vblp of the bit line. This Vblp generation circuit 41 is basically formed of a source follower circuit of an N channel MOSFET to generate a voltage having its level shifted from the level of power supply voltage Vcc by the threshold voltage of the MOSFET to generate a voltage of a level divided into ½ (half precharge voltage).

In the present embodiment, ground voltage Vss is used as cell plate voltage Vcp. Usage of a half precharge voltage allows further improvement of the withstand voltage property of the capacitor insulating film of the capacitor. In this case, it is desirable to provide a circuit independent to Vblp generation circuit 41, and not use the half precharge voltage from Vblp generation circuit 41.

Negative voltage Vbb from Vbb generation circuit 40 is supplied to row decoder 42. Precharge voltage Vblp is supplied to a precharge circuit that will be described afterwards as a precharge signal. Cell plate voltage Vcp is supplied to the memory cell capacitor.

Figure 6:
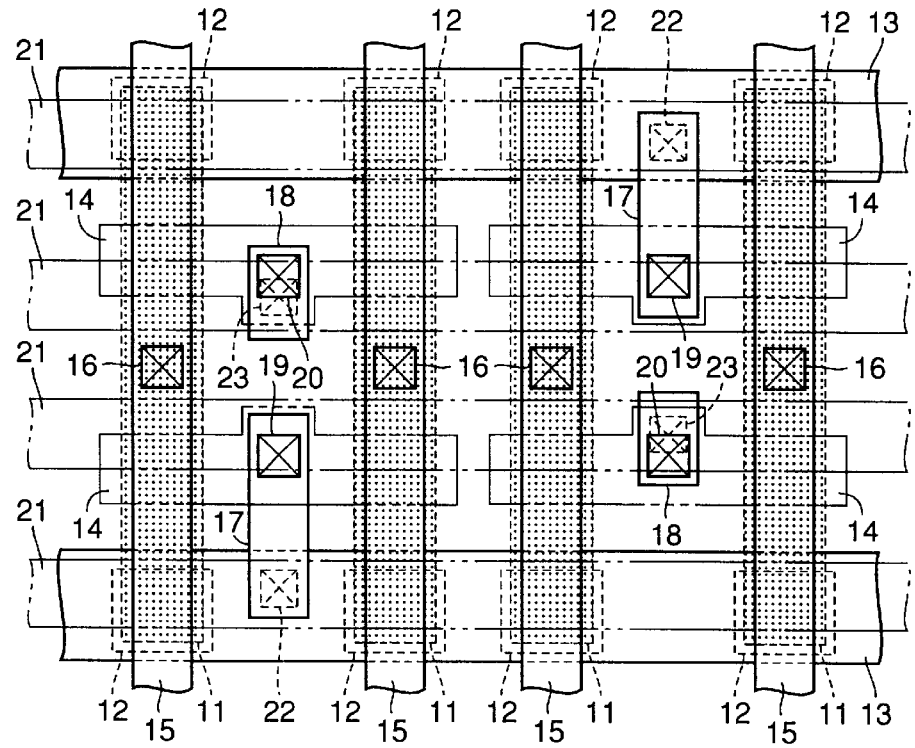
FIG. 6 is a partial plan view of the layout of the sub array shown in FIG. 5.

FIG. 6 is a plan view of the main part of the memory cell structure of sub array 32. Referring to FIG. 6, a plurality of N type semiconductor regions 11 (source/drain) are formed in short strips at a main surface of a P type semiconductor substrate (silicon substrate) or a P type well region. Semiconductor region 11 extends in the column direction, having both ends aligned. A trench 12 is formed at the main surface of the semiconductor substrate so as to overlap both ends of the plurality of semiconductor regions 11. Cell plate electrode 13 of polycrystalline silicon is formed on the semiconductor substrate continuously in the row direction to overlap trench 12 with a capacitor insulating film (not shown) thereunder. Accordingly, a trench type memory cell capacitor that retains charge between semiconductor region 11 and cell plate electrode 13 is formed in trench 12.

Figure 1B:
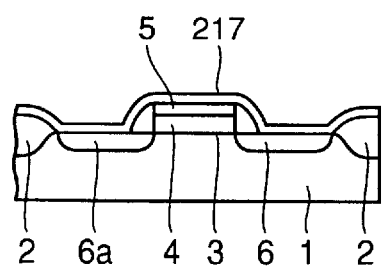
Figure 2A:
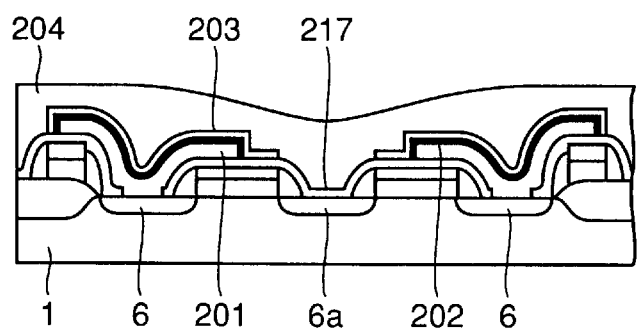
Figure 2B:
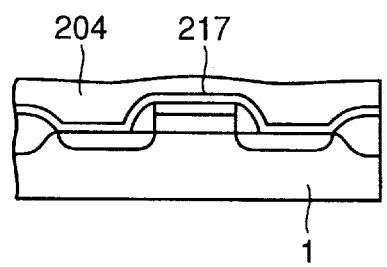
Figure 3A:
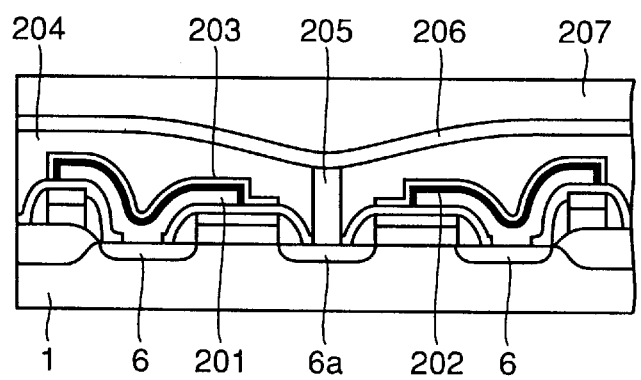
Figure 3B:
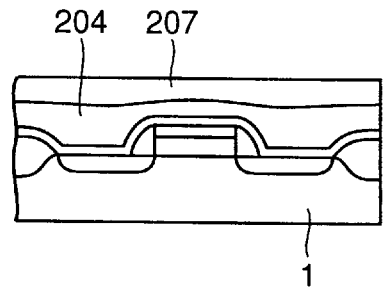

Two gate electrodes 14 with a predetermined distance therebetween are arranged between cell plate electrodes 13 so as to cross semiconductor region 11. Gate electrodes 14 are independent in the unit of two columns, and formed in the same step at a layer identical to that of cell plate electrode 13. The gate insulating film beneath gate electrode 14 is formed in the same step at the layer identical to that of the capacitor insulating film under cell plate electrode 13. Since gate electrode 14 and the underlying gate insulating film are formed in the same step at a layer identical to that of the gate electrode and the gate insulating film of the MOSFET of the logic circuit region (gate electrode 4 and gate oxide film 3 in FIGS. 1A and 1B), cell plate electrode 13, gate electrode 14, and the gate electrode of the FET of the logic circuit region are all formed in the same step at the same layer. The insulating films below respective electrodes are also formed in the same step at the same layer with equal film thickness. Accordingly, the fabrication step can be simplified. Also, the number of layers to be provided is reduced to lower the cost. Furthermore, the turn around time (TAT) can be reduced.

Bit line 15 is formed of aluminum, for example, extending in the column direction along each semiconductor region 11, arranged on gate electrode 14 with an insulating film thereunder. This bit line 15 is electrically connected to semiconductor region 11 through a contact hole 16 between gate electrodes 14.

Semiconductor region 11 to which bit line 15 is connected is an island-type region disconnected from the trench capacitor by gate electrode 14, electrically independent to form a drain region. Intermediate lines 17 and 18 overlap gate electrode 14 between bit lines 15, and extend in the column direction. Intermediate line 17 is formed to extend up to plate electrode 13 whereas intermediate line 18 has a short length slightly extruding from the end of gate electrode 14. Intermediate lines 17 and 18 are formed in the same step at a layer identical to that of bit line 15, and electrically connected to respective gate electrodes 14 through contact holes 19 and 20.

Word line 21 is formed of aluminum, for example, extending in a direction crossing bit line 15, and arranged on bit line 15 and intermediate line 17 with an insulating film thereunder. This word line 21 is arranged on cell plate electrode 13 and gate electrode 14 to be electrically connected to intermediate line 17 via contact hole 22 on cell plate electrode 13 and electrically connected to intermediate line 18 via contact hole 23 on gate electrode 14. Therefore, each word line 21 is connected to gate electrode 14 via intermediate lines 18 and 19 to apply a select signal to each gate electrode 14.

Local power supply line 36 and local ground line 37 are arranged on word line 21 with an insulating film thereunder.

Word line 21 is connected for every other one gate electrode 14 arranged in the same row. More specifically, gate electrodes 14 arranged corresponding to the (4n)th column (n is an integer) and the (4n+1)th column are commonly connected to word lines 21 arranged at the (4n+1)th row and the (4n+2)th row. Gate electrodes 14 arranged corresponding to the (4n+2)th column and (4n+3)th column are connected in common to word lines 21 arranged at the (4n)th row and (4n+3)th row. Accordingly, each word line 21 can be selected and rendered active for every other one pair of memory cell transistors for each row, the two memory cell transistors adjacent to each other in the row direction as one pair.

In the memory cell of the above-described structure, gate electrode 14 is connected to a sense amplifier so as to combine the columns that are isolated from each other.

Figure 7A:
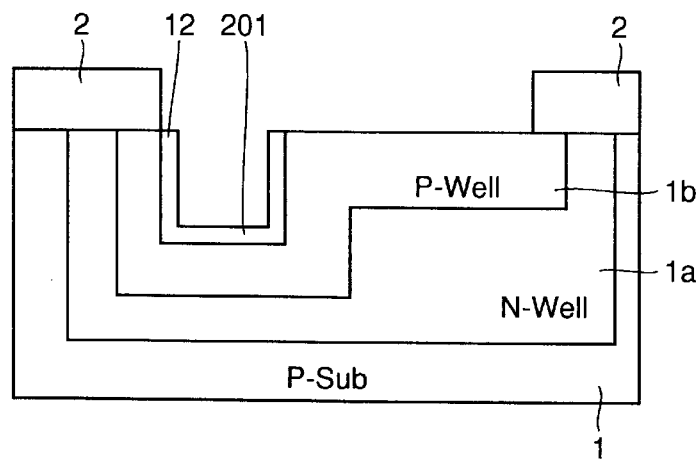
FIGS. 7A to 9B are sectional views of the semiconductor memory device of FIG. 4A showing a fabrication process thereof.
Figure 7B:
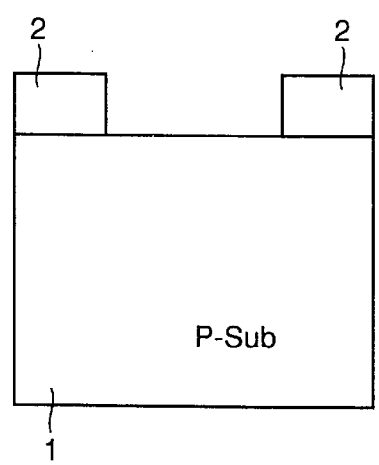

In the semiconductor memory device of the present embodiment, a DRAM circuit and a logic circuit that controls the DRAM circuit are formed on the same silicon substrate. FIGS. 7A to 9B are sectional views of this semiconductor memory device showing the fabrication steps partially. As shown in FIG. 7A, a trench 12 is formed at the DRAM region of silicon substrate 1. Also, an N type well 1a and a P type well 1b are formed. A storage electrode 201 is formed in trench 12. As shown in FIGS. 7A and 7B, a field oxide film 2 for element isolation is formed at the region excluding the element region.

Figure 8A:
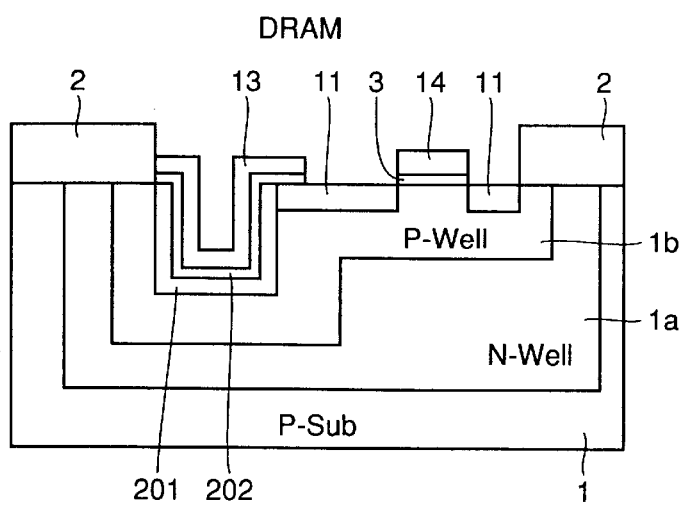
Figure 8B:
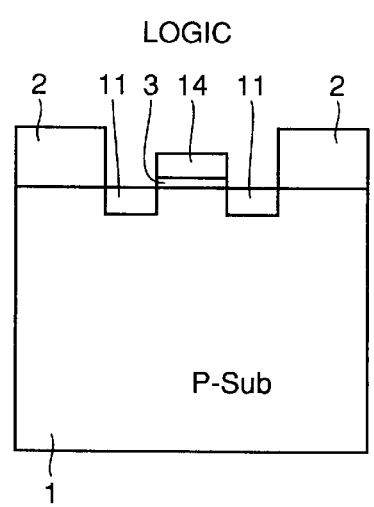

As shown in FIGS. 8A and 8B, a capacitor insulating film 202 is formed on storage electrode 201. At the same time, gate oxide film 3 of the memory cell transistor and gate oxide film 3 of the transistor that constitutes the logic circuit are formed. Then, cell plate electrode 13 is formed on capacitor insulating film 202. At the same time, gate electrode 14 of the memory cell transistor and gate electrode 14 of the transistor that constitutes the logic circuit are formed.

Figure 9A:
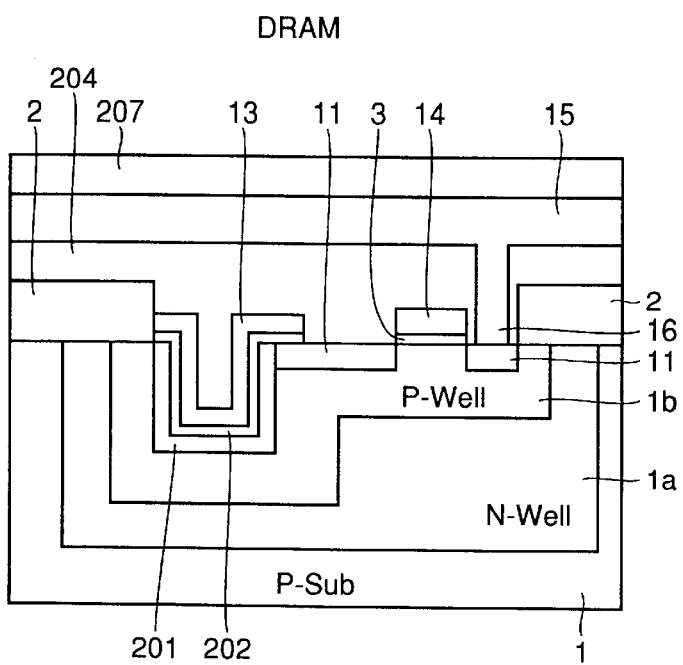
Figure 9B:
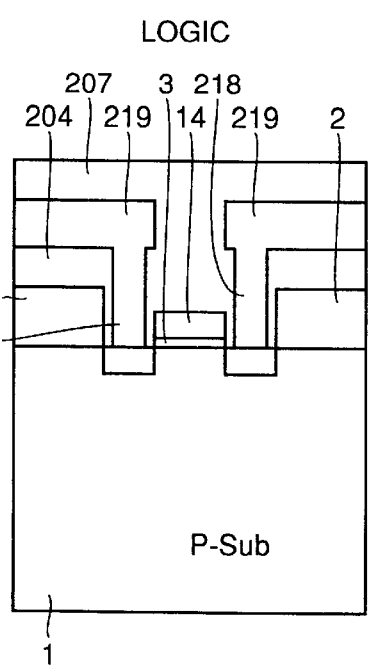

As shown in FIGS. 9A and 9B, an interlayer insulating film 204 is formed all over the DRAM region and logic circuit region. Then, contact holes 16 and 218 are formed at predetermined positions in interlayer insulating film 204. Next, bit line 15 and line 219 are formed. Then, an interlayer insulating film 207 is formed all over the DRAM region and the logic circuit region.

Since capacitor insulating film 202 of the memory cell capacitor and gate oxide film 3 of the transistor that forms the logic circuit are provided at the same step, both films have substantially the same thickness. Also, cell plate electrode 13 of the memory cell capacitor is connected to ground line 37. It is therefore not necessary to provide a circuit such as a Vblp generation circuit 41 to supply a cell plate voltage.

Figure 10:
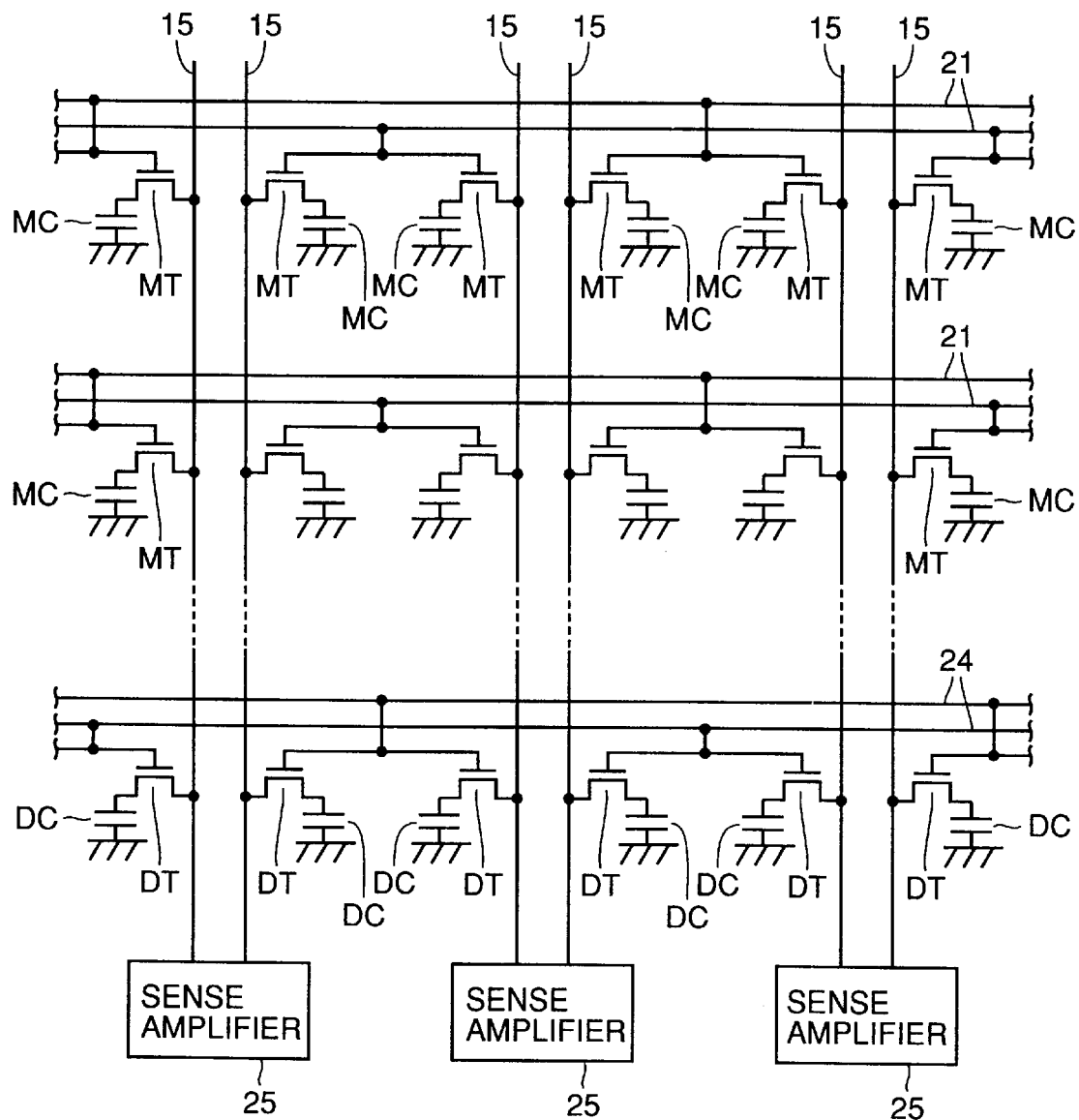
FIG. 10 is a circuit diagram of the sub array of FIG. 5.

FIG. 10 is a circuit diagram of a DRAM. Referring to FIG. 10, a plurality of memory cells are arranged in a matrix, each memory cell formed of a memory cell transistor MT and a memory cell capacitor MC. Memory cell transistor MT includes a gate electrode 14 and a semiconductor region 11 isolated by gate electrode 14.

The threshold value of each memory cell transistor MT is set to a value (approximately 0.4–0.5 V) lower than the threshold value (0.7 V) of the NMOSFET of the logic circuit region. Accordingly, the second term of equation ① becomes smaller to allow increase of the storage capacity.

In the present embodiment, the number of memory cell transistors MT connected to the complementary pair of bit lines 15 and 15 is set to not more than 256 in order to maintain the ratio of parasitic capacitance CB of the bit line to capacitance CS of the memory cell capacitor (CB/CS) to 5–15 and ensure the data read out voltage in a memory access operation.

Memory cell capacitor MC is formed of a storage electrode 201 located in trench 12 and a cell plate electrode 13 covering storage electrode 201, and connected to the source of each memory cell transistor MT by sharing semiconductor region 11.

Bit line 15 is arranged corresponding to each column of memory cell transistors MT, and connected to the drain of memory cell transistor MT for every one column. Two word lines 21 are arranged corresponding to each row of memory cell transistors MT. The gates of memory cell transistors MT of two continuous columns are connected to one of the two word lines 21 via intermediate lines 17 and 18. More specifically, one of the two word lines 21 is connected to the gate of memory cell transistors MT arranged at the (4n)th column and the (4n+1)th column via intermediate line 17, whereas the other of the two word lines 21 is connected to the gate of memory cell transistors MT arranged at the (4n+2)th column and (4n+3)th column via intermediate line 18.

Figure 11:
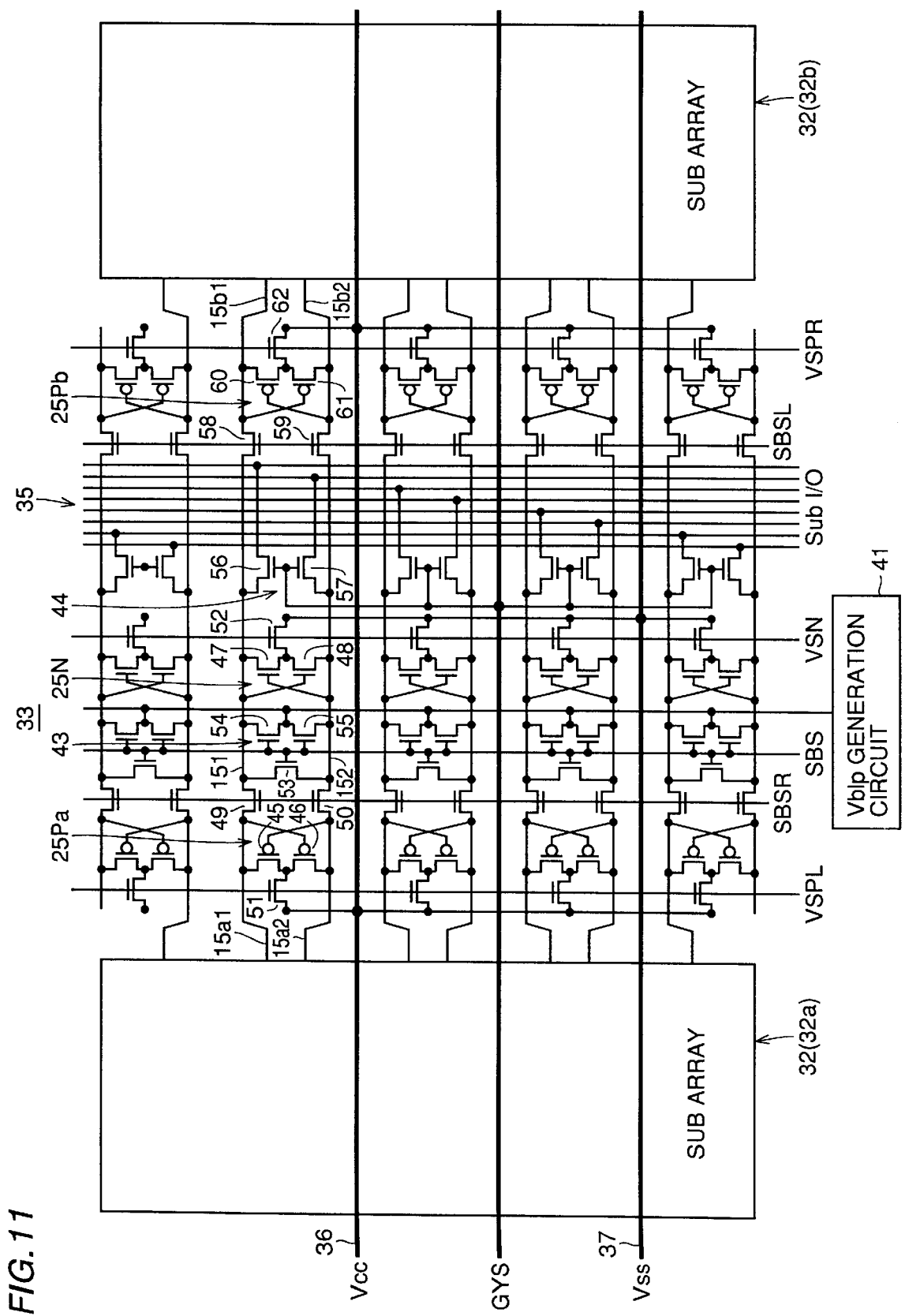
FIG. 11 is a circuit diagram of the sense amplifier band shown in FIG. 5.

FIG. 11 is a circuit diagram showing the main part of memory cell array 33. As described before, memory cell array 33 is formed of two complementary sub arrays 32 (32a, 32b) and a shared sense type sense amplifier band 35 provided therebetween. Each of sub arrays 32a and 32b includes a plurality of bit line pairs. Sense amplifier band 35 includes a P channel sense amplifier 25Pa provided for every one pair of bit lines 15a1 and 15a2, a P channel sense amplifier 25Pb provided for every one pair of bit lines 15b1 and 15b2, an N channel sense amplifier 25N provided in common to two pairs of bit lines 15a1, 15a2, 15b1 and 15b2, a precharge circuit 43, a local input/output line SubI/O, and a switch circuit 44 to transfer the data on the bit line to input/output line pair SubI/O.

One sense amplifier 25 of FIG. 10 is formed of one P channel sense amplifier 25Pa or 25Pb and one N channel sense amplifier 25N. Each P channel sense amplifier 25Pa is formed of P channel MOSFET (referred to as PMOSFET hereinafter) 45 and 46 having their gates and drains cross-coupled, and set to a latch status. Each P channel sense amplifier 25Pb is formed of PMOSFET 60 and 61 having their gates and drains cross-coupled and set in a latch status. Each N channel sense amplifier 25N is formed of N channel MOSFET (referred to as NMOSFET hereinafter) 47 and 48 having their gates and drains cross-coupled, and set in a latch status.

One pair of bit lines 15a1 and 15a2 extending from one sub array 32 is connected to one pair of common bit lines 151 and 152 via switching transistors (NMOSFET) 49 and 50. One pair of bit lines 15b1 and 15b2 extending from the other sub array 32b are connected to one pair of common bit lines 151 and 152 via switching transistors (NMOSFET) 58 and 59. N channel sense amplifier 25N is connected between common bit lines 151 and 152.

Switching transistors 49 and 50 have their gates connected in common to a sub array select signal line SBSR. In the present embodiment, switching transistors 49 and 50 have a threshold value identical to that of the NMOSFET employed in the logic circuit region, not the low threshold value as of memory cell transistor MT. Therefore, the voltage amplitude range of SBSR can be set to Vss-Vcc.

Switching transistors 49 and 50 are located at the opposite side to sub array 32a than P channel sense amplifier 25Pa.

PMOSFET 45 and 46 have each source connected to local power supply line 36 via drive transistor (NMOSFET) 51. Four P channel sense amplifiers 25Pa are connected in common to one local power supply line 36. Each gate of drive transistor 51 is connected in common to an activation signal line VSPL.

In the present embodiment, drive transistor 51 is formed in a step identical to that of memory cell transistor MT, having the threshold value set to the same low threshold value. Therefore, a voltage shifted in level by the threshold value of drive transistor 51 from the level of power supply voltage Vcc can be supplied to bit lines 15a1 and 15a2 of sub array 32a. The maximum potential difference between gate electrode 14 connected to word line 21 and bit lines 15a1 and 15a2 can be alleviated. The withstand voltage of the gate insulating film of memory cell transistor MT can be ensured to improve the reliability. Also, since the voltage of the higher bit line becomes lower than power supply voltage Vcc by the threshold value of memory cell transistor MT, the restore voltage can be reduced to lower power consumption.

By effecting voltage drop using drive transistor 51, the voltage amplitude range of an activation signal line VSPL can be set to Vss-Vcc, not Vbb-Vcc. Therefore, only word line 21 is the signal group that has negative bias control. As a result, the additional negative bias control circuit with respect to drive transistor 51 is no longer required, and power consumption can be reduced. Power supply voltage Vcc and ground voltage Vss are supplied alternately from DRAM control circuit 39 shown in FIG. 5 to activation signal line VSPL.

NMOSFET 47 and 48 have each source connected to local ground line 37 via drive transistor (NMOSFET) 52. Four N channel sense amplifiers 25N corresponding to the four P channel sense amplifiers 25Pa connected to one local power supply line 36 are connected in common to one local ground line 37. Each gate of drive transistor 52 is connected in common to an activation signal line VSN. More specifically, drive transistors 51 and 52 are turned on by activation signal lines VSPL and VSN, whereby the voltage required for the operation of sense amplifier 25 is supplied.

Precharge circuit 43 includes an NMOSFET 53 provided between PMOSFET 45 and 46 and NMOSFET 47 and 48 to short-circuit one pair of common bit lines 151 and 152, and NMOSFET 54 and 55 to supply precharge voltage Vblp to bit lines 151 and 152. A circuit activation signal SBS (power supply voltage Vcc in present embodiment) is supplied to NMOSFET 53–55.

Switch circuit 44 is formed of NMOSFET 56 and 57, and controlled according to a column select signal GYS. In the present embodiment, four pair of bit lines can be selected by one column select signal GYS. Alternatively, two, eight or more pairs of bit lines can be selected by one column select signal GYS. The data of each bit line pair is connected to input/output line SubI/O via switch circuit 44.

Switching transistors 58 and 59 have each gate connected in common to a sub array select signal line SBSL. PMOSFET 60 and 61 have each source connected in common to local power supply line 36 via drive transistor (NMOSFET) 62. Four P channel sense amplifiers 25Pb are connected in common to one local power supply line 36. Drive transistor 62 has each gate connected in common to activation signal line VSPR. Similar to drive transistor 51, drive transistor 62 has the threshold value set to a low value in a step identical to that of memory cell transistor MT. Therefore, the voltage amplitude range of sub array select signal line SBSL can be set to Vss–Vcc.

Figure 12:
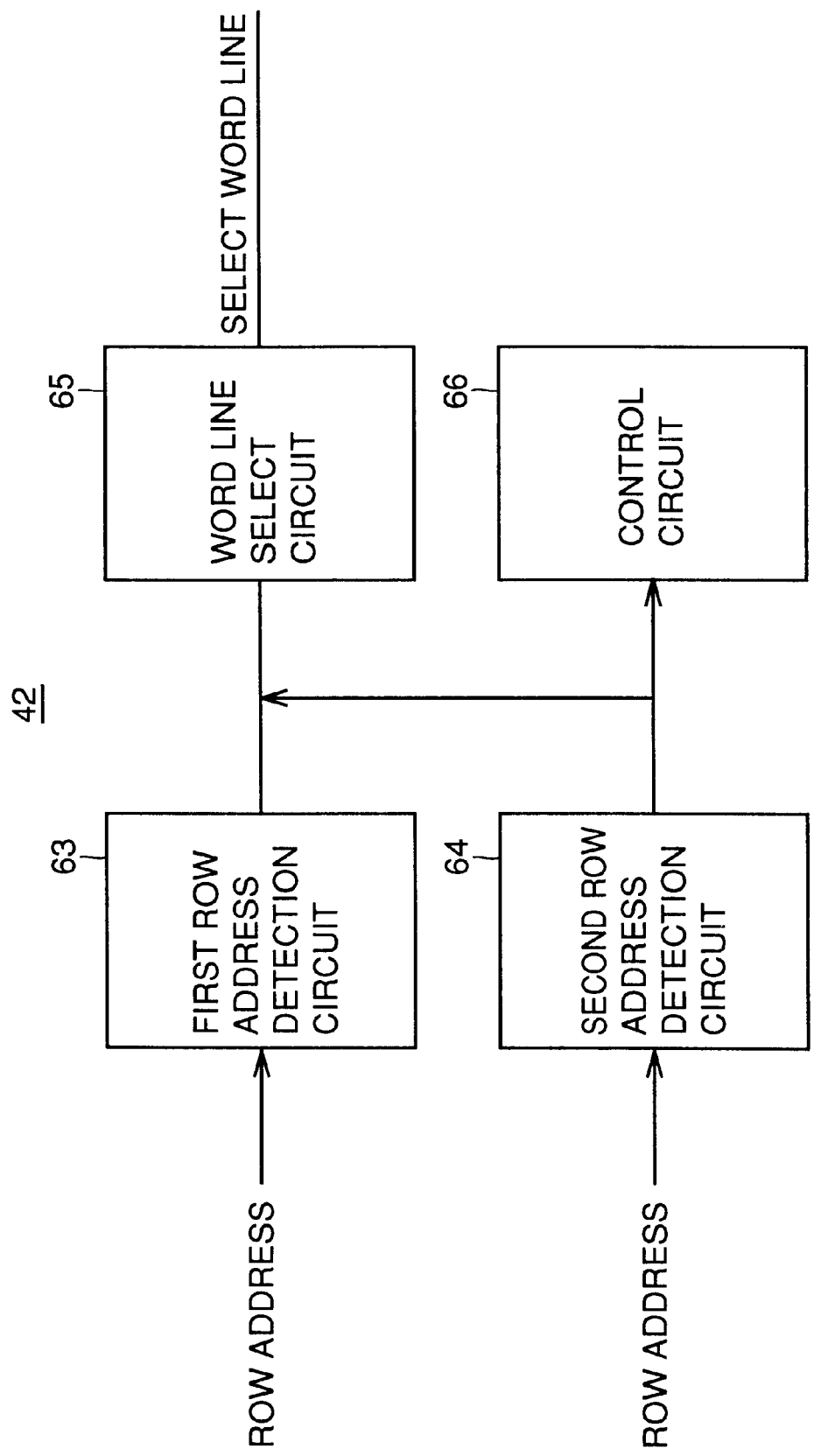
FIG. 12 is a block diagram of the row decoder of FIG. 5.

FIG. 12 is a block diagram showing a row decoder 42 for word line selection. Row decoder 42 includes a first row address detection circuit 63, a second row address detection circuit 64, a word line select circuit 65, and a control circuit 66. By this row decoder 42, one word line address is eventually selected out from the four word line addresses selected at first row address detection circuit 63.

Figure 13:
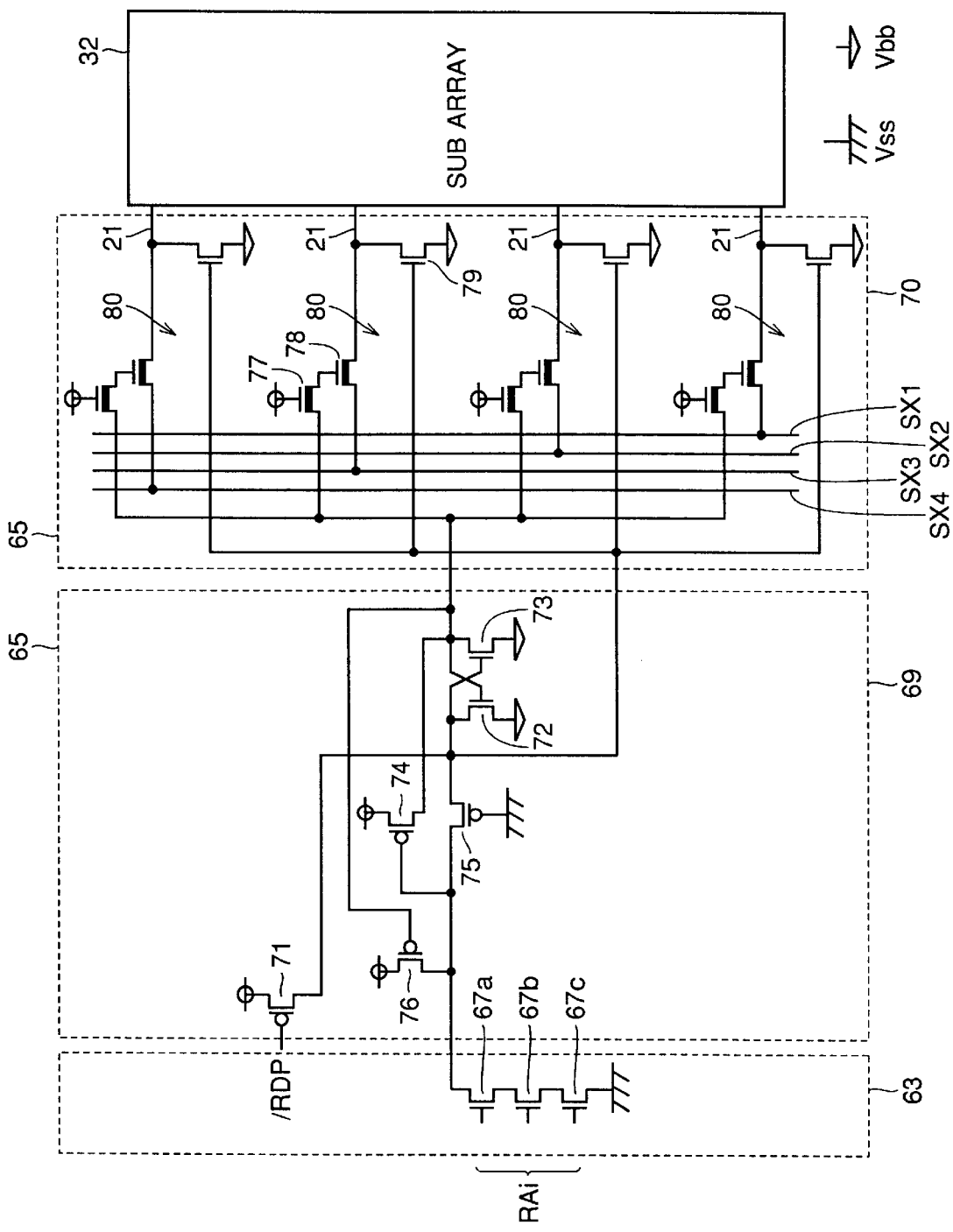
FIG. 13 is a circuit diagram of a first row address detection circuit and a word line select circuit unit of FIG. 12.

FIG. 13 is a specific circuit diagram of first row address detection circuit 63 and word line select circuit 65. First row address detection circuit 63 is formed of three stages of vertical-layered NMOSFET 67a–67c with a row address as the input signal. Word line select circuit 65 is formed of a logic circuit 69 and a word line driver 70.

Logic circuit 69 includes a PMOSFET 71 having a gate connected to a signal supply line (/RDP) to precharge when the row decoder is rendered inactive, NMOSFET 72 and 73 having their gates and drains cross-coupled, and set in a latch status, a PMOSFET 74 having its drain connected to the drain of NMOSFET 73, and having a gate connected to the output terminal of first row address detection circuit 63, a PMOSFET 75 connected between the drain of NMOSFET 72 and the gate of PMOSFET 74, and a PMOSFET 76 having a gate connected to the drain of NMOSFET 73 and a drain connected to the gate of PMOSFET 74. Power supply voltage Vcc is applied to the source of each of PMOSFET 71, 74 and 76. Ground voltage Vss is applied to the gate of PMOSFET 75. Negative voltage Vbb is applied to the source of NMOSFET 72 and 73.

According to the above-described structure of logic circuit 69, PMOSFET 75 having its gate connected to ground voltage Vss serves to convert the source potential and affirmatively cut off PMOSFET 74. As a result, the desired operation can be realized without having to use a logic element such as an inverter or the like. The number of elements can be reduced to save the area. Also, generation of a through current can be prevented in operation transition. There is also the advantage of facilitating the speed of the operation.

To each word line 21 of sub array 32 is connected the output side of a drive circuit 80 formed of NMOSFET 77 and 78 connected in two stages and an NMOSFET 79 having its drain connected to the output side of NMOSFET 77 and 78. Four drive circuits 80 form word line driver 70 as one set.

In word line driver 70, the drain of NMOSFET 77 of each drive circuit 80 is connected in common to the output end of logic circuit 69. The drain of NMOSFET 78 is connected to the four select signal lines SX1–SX4 from control circuit 66.

NMOSFET 79 of each drive circuit 80 has its gate connected to PMOSFET 71 of logic circuit 69 and has its source applied with negative voltage Vbb. According to the signal from PMOSFET 71 of logic circuit 69, NMOSFET 79 is ON during the inactive state of the row decoder. The potential of word line 21 is maintained at Vbb.

NMOSFET 77 of each drive circuit 80 is always at a state that can be turned on since power supply voltage Vcc is constantly supplied to the gate. In response to a signal from logic circuit 69, each NMOSFET 77 of the four drive circuits 80 are all turned on. In response, NMOSFET 78 located as the succeeding stage of NMOSFET 77 attains a state that can be turned on. At this time point, four word lines 21 are selected.

Then, signal is transferred for only NMOSFET 78 connected to one of the four select signal lines SX1–SX4 from control circuit 66 that is rendered active, whereby eventually one word line 21 is selected.

Figure 14:
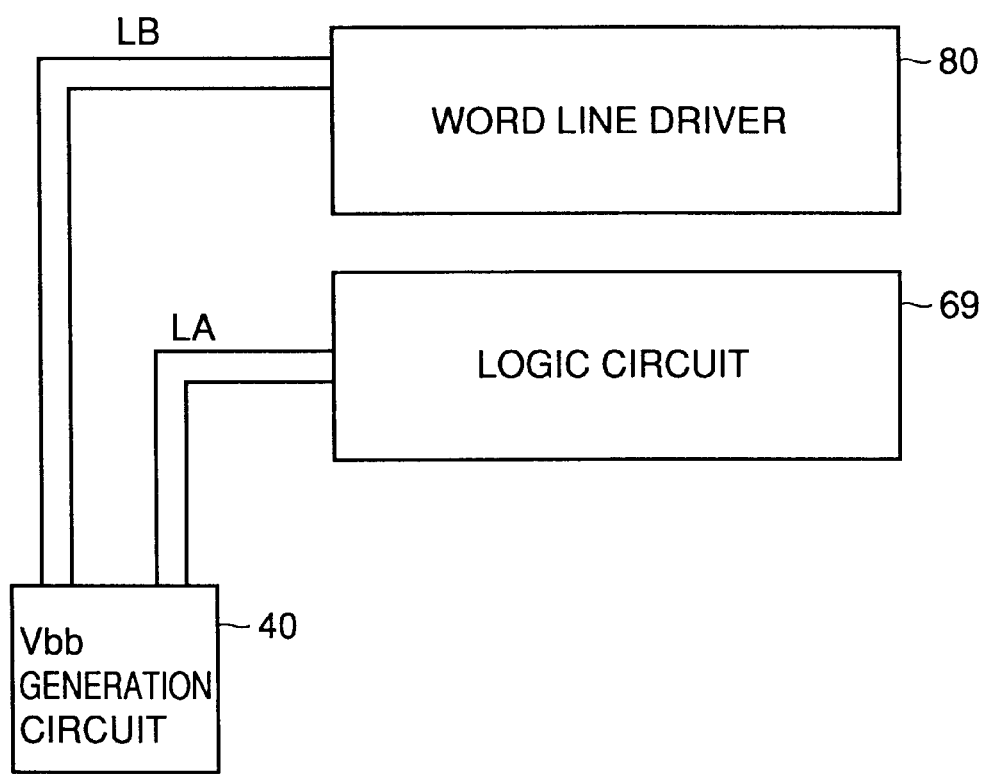
FIG. 14 is a block diagram showing the supply of a negative voltage to the word line driver and logic circuit shown in FIG. 13.

Here, negative voltage Vbb is supplied to NMOSFET 72 and 73 of logic circuit 69 and NMOSFET 79 of drive circuit 80. In the present embodiment, the supply line LA from Vbb generation circuit 40 to logic circuit 69 is formed of a line of a different group from the supply line LB from Vbb generation circuit 40 to drive circuit 80 on the layout basis, as shown in FIG. 14. Conventionally, if the source of NMOSFET 72 and 73 that outputs the charge is short-circuited with the source of NMOSFET 79 that serves only to maintain word line 21 at the potential level of Vbb when logic circuit 69 is operated, the charge output from NMOSFET 72 and 73 becomes the noise source to increase the potential of word line 21, whereby leakage of the stored charge is facilitated from the memory cell. In the present embodiment, supply line LB is provided separately to be impervious to the noise.

In the present embodiment, the two stages of NMOSFET 77 and 78 of each drive circuit 80 are set to a low threshold value identical to that of memory cell transistor MT. Therefore, the voltage applied to the gate of NMOSFET 78 (Vcc—the threshold value of NMOSFET 77) is increased and the turn-on time of NMOSFET 78 becomes shorter. As a result, the rising speed of word line 21 becomes faster.

Figure 15:
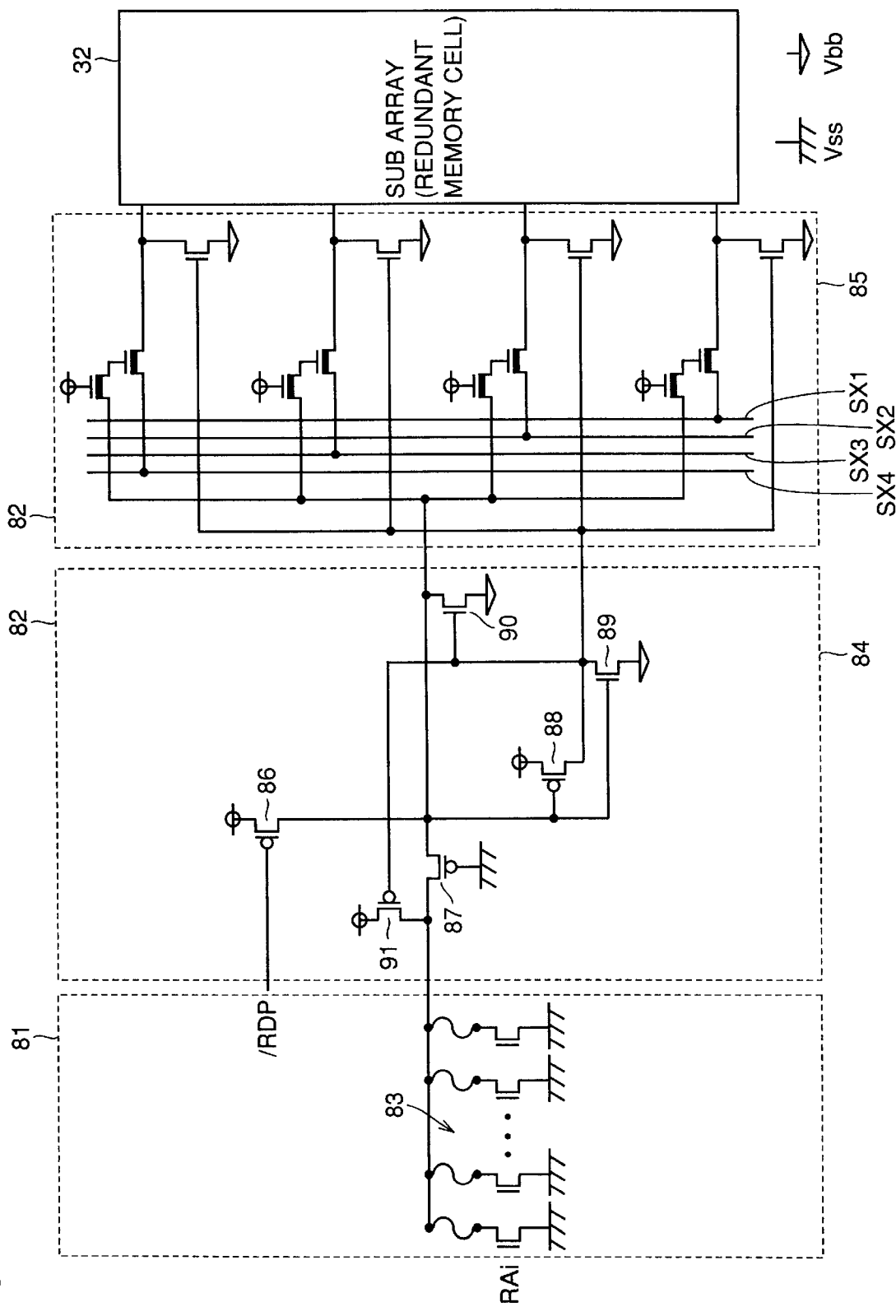
FIG. 15 is a circuit diagram of a redundant circuit that can replace the first row address detection circuit and word line select circuit of FIG. 13.

FIG. 15 is a specific circuit diagram of a redundant row address detection circuit 81 and a word line select circuit 82 in the redundant row decoder. Redundant row address detection circuit 81 is formed of the well-known fuse circuit 83 to program a redundancy address. Word line select circuit 82 is formed of a logic circuit 84 and a word line driver 85. The structure of word line driver 85 is identical to that of word line driver 70.

Logic circuit 84 includes a PMOSFET 86 having its gate connected to a signal supply line (/RDP) for precharge when the row decoder is rendered inactive, a PMOSFET 87 having its source connected to the output of redundant address detection circuit 81, its drain connected to the drain of PMOSFET 86, and having a source signal that becomes the first output to word line driver 85, a PMOSFET 88 having its gate connected to the drain of PMOSFET 87, and having a drain signal that becomes the second output to word line driver 85, an NMOSFET 89 having its drain connected to the drain of PMOSFET 88, and a gate connected to the drain of PMOSFET 87, an NMOSFET 90 having its gate connected to the drain of PMOSFET 88, and its drain connected to the drain of PMOSFET 87, and a PMOSFET 91 having its gate connected to the drain of PMOSFET 88, and its drain connected to the source of PMOSFET 87. Power supply voltage Vcc is applied to each source of PMOSFET 86, 88 and 91. Ground voltage Vss is applied to the gate of PMOSFET 87. Negative voltage Vbb is supplied to each source of NMOSFET 89 and 90.

Figure 16:
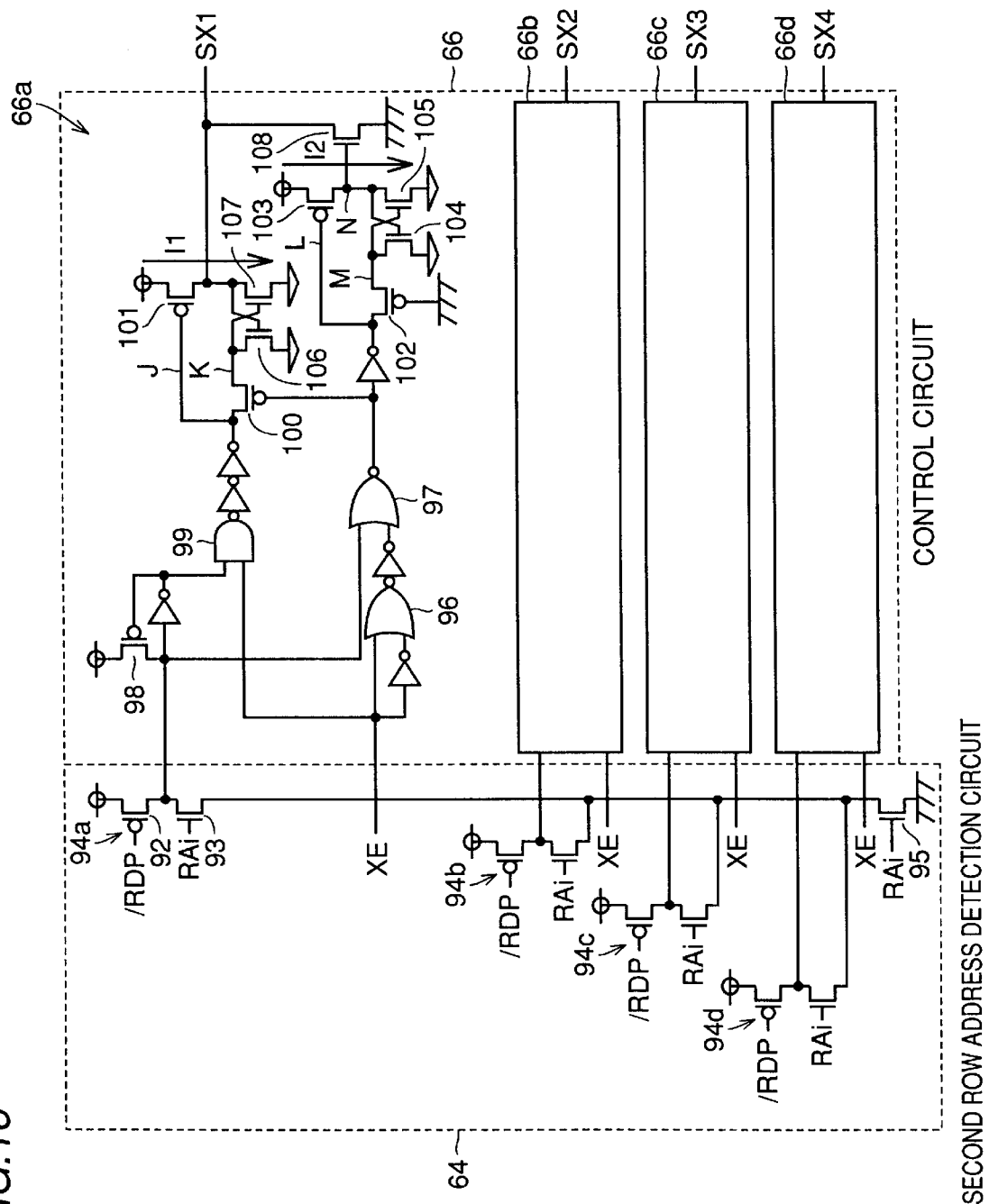
FIG. 16 is a circuit diagram of a second row address detection circuit and control select circuit shown in FIG. 12.

FIG. 16 is a specific circuit diagram of second row address detection circuit 64 and control circuit 66. Second row address detection circuit 64 has four select circuits 64a–64d connected in parallel, formed of a series of a PMOSFET 92 and an NMOSFET 93. Power supply voltage Vcc is applied to the input end of the parallel circuit. The output end is connected to ground voltage Vss (connected to ground) via NMOSFET 95.

A signal supply line (/RDP) is connected to the gate of PMOSFET 92 of each of select circuits 94a–94d. A select signal RAi of word line 21 is applied to the gate of NMOSFET 93 of each of select circuits 94a–94d. One of select circuits 94a–94d is identified by this select signal RAi.

Control circuit 66 is formed of four control circuit units 66a–66d. One select signal line (SX1–SX4) is provided from each of control circuit units 66a–66d. This select signal line is connected to a corresponding drive circuit 80 of word line driver 70.

The input terminal of control circuit unit 66a is connected to the output terminal of select circuit 94a. Similarly, the input terminal of control circuit unit 66b is connected to the output terminal of select circuit 94b. The input terminal of control circuit unit 66c is connected to the output terminal of select circuit 94c. The input terminal of control circuit unit 66d is connected to the output terminal of select circuit 94d. A control circuit unit is identified according to the identified select circuit. As a result, a word line 21 is identified.

Since the specific circuit structure of each of control circuit units 66a–66d is identical, only the structure of control circuit unit 66a will be described hereinafter.

A signal XE that allows word line selection (the signal defining the selection period of word line 21) and an inverted signal thereof are applied to a NOR circuit 96. An inverted signal of the output from NOR circuit 96 and the output signal from select circuit 94a are applied to an NOR circuit 97. Select circuit 94a has its output terminal connected to the drain of PMOSFET 98. The inverted signal of the output terminal of select circuit 94a is applied to the gate of PMOSFET 98 and also applied to a NAND circuit 99. Signal XE is applied to the other input terminal of NAND circuit 99. A signal corresponding to the signal from NAND circuit 99 inverted twice is applied to the source of PMOSFET 100 and the gate of PMOSFET 101.

NOR circuit 97 has its signal applied to the gate of PMOSFET 100 and an inverted signal thereof applied to the source of PMOSFET 102 and the gate of PMOSFET 103. The drain of PMOSFET 102 is connected to the drain of NMOSFET 104 out of NMOSFET 104 and 105 that have their gates and drains cross-coupled and set in a latch status. The drain of PMOSFET 103 is connected to the drain of NMOSFET 105.

PMOSFET 100 has its drain connected to the drain of NMOSFET 106 out of NMOSFET 106 and 107 having their gates and drains cross-coupled and set at a latch state. PMOSFET 101 has its drain connected to the drain of NMOSFET 107.

Select signal line SX1 provided from control circuit unit 66a is connected to the drain of NMOSFET 108. NMOSFET 108 has its gate connected to the drain of PMOSFET 103 (the drain of NMOSFET 105). Also, NMOSFET 108 has its drain connected to the drain of PMOSFET 101 (the drain of NMOSFET 107).

Power supply voltage Vcc is applied to each source of PMOSFET 98, 101 and 103. Ground voltage Vss is applied to the gate of PMOSFET 102 and the source of NMOSFET 108. Negative voltage Vbb is applied to each source of NMOSFET 104, 105, 106 and 107.

Figure 17:
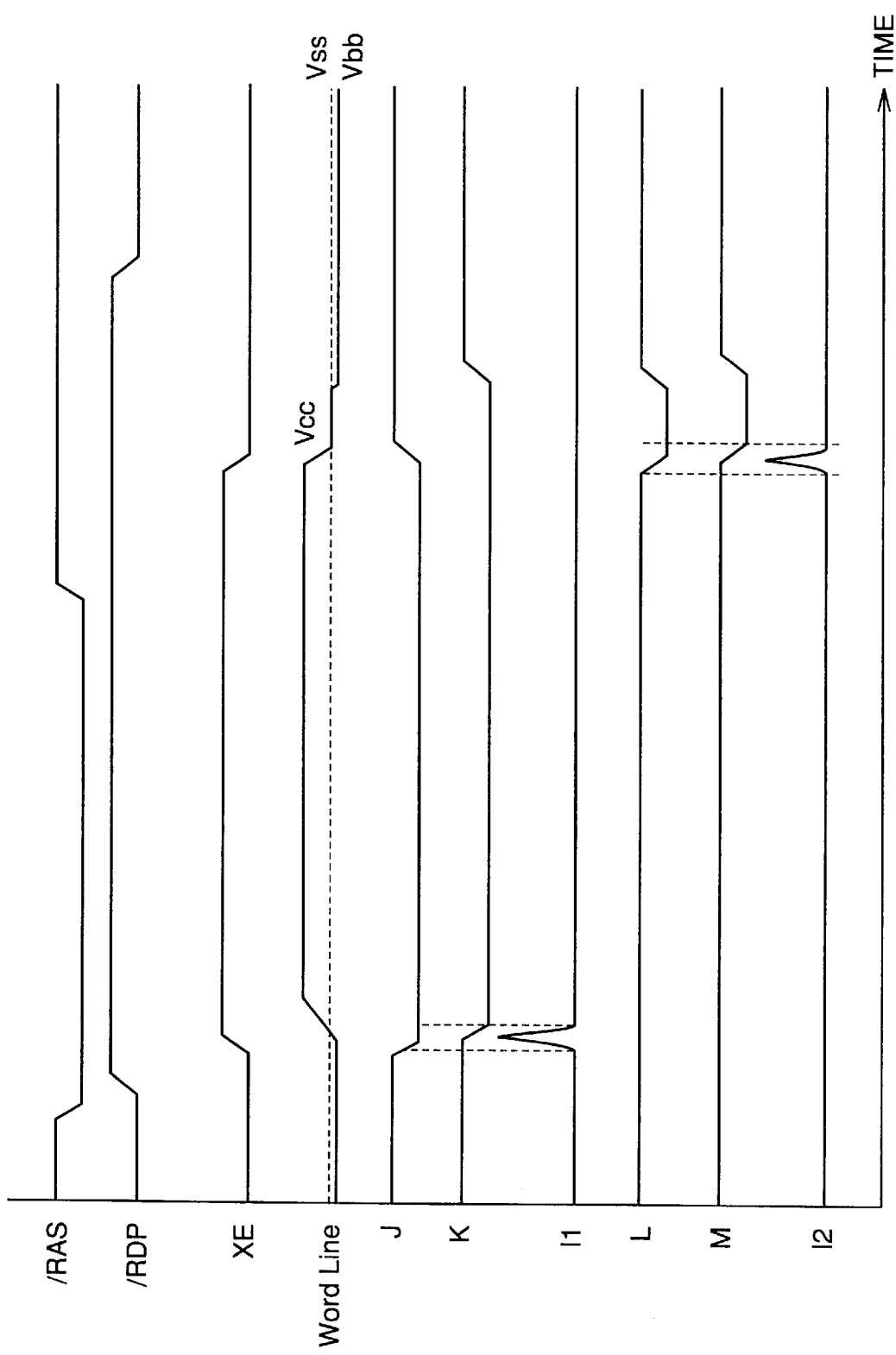
FIG. 17 is a timing chart representing an operation of the control circuit of FIG. 16.

The operation of control circuit unit 66a of the above structure will be described hereinafter with reference to the timing chart of FIG. 17. In response to activation of a row address strobe signal /RAS, a signal /RDP attains an H level (logical high) and signal XE attains an H level, whereby the potential of nodes J and K attain an L level (logical low). As a result, PMOSFET 101 is turned on and NMOSFET 107 is turned off, whereby power supply voltage Vcc is supplied to select signal line SX1. Thus, the voltage of word line 21 attains the level of power supply voltage Vcc by word line driver 85 shown in FIG. 15.

When signal XE attains an L level, the potential of node J is driven to an H level and the potential of nodes L and M are driven to an L level. In response to the potential of node J attaining an H level, PMOSFET 101 is turned off, whereby the supply of power supply voltage Vcc to select signal line SX1 is suppressed. When the potential of node L attains an L level, PMOSFET 103 is turned on. When the potential of node M attains an L level, NMOSFET 105 is turned off. Accordingly, power supply voltage Vcc is applied to the gate of NMOSFET 108, whereby NMOSFET 108 is turned on. The voltage of select signal line SX1 is lowered to the level of ground voltage Vss. Therefore, the voltage of the word line is also reduced to the level of ground voltage Vss. At an elapse of a predetermined time from the fall of signal XE, the potentials of nodes K, L and M all attain an L level. In response to the potential of node K attaining an L level, NMOSFET 107 is turned on, whereby the voltage of select signal line SX1 is reduced to the level of negative voltage Vbb. When the potential of node L attains an H level, PMOSFET 103 is turned off. When the potential of node M attains an H level, NMOSFET 105 is turned on. Therefore, the gate voltage of NMOSFET 108 is reduced to the level of negative voltage Vbb, whereby NMOSFET 108 is turned off.

According to the above-described circuit structure, the three voltages of negative voltage Vbb, power supply voltage Vcc and ground voltage Vss are switched appropriately at control circuit unit 66a to be output through select signal line SX1.

There is a problem of through currents I1 and I2 flowing in control circuit unit 66a when signal XE rises or falls. More specifically, although the potential of node J is immediately driven to an L level in response to signal XE attaining an H level, the potential of node K is driven to an L level delayed by the transmission time of PMOSFET 100. Since PMOSFET 101 and NMOSFET 107 are turned on simultaneously, through current I1 will flow. Furthermore, although the potential of node L is immediately driven to an L level in response to signal XE attaining an L level, the potential of node M is driven to an L level with a delay corresponding to the transmission time by PMOSFET 102. Therefore, PMOSFET 103 and NMOSFET 105 are turned on simultaneously, whereby through current I2 flows. This flow of through currents I1 and I2 causes a significant increase in negative voltage Vbb. This means that Vbb generation circuit 40 must restore the boosted negative voltage Vbb to the level of the predetermined voltage. A great drive capability is required therefor. Also, power consumption is increased.

Figure 18:
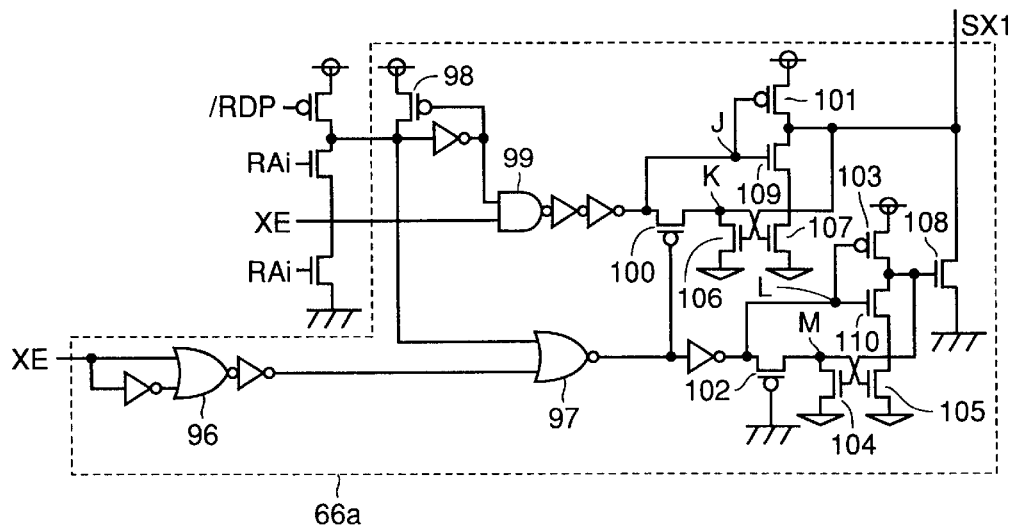
FIG. 18 is a circuit diagram showing another example of the control circuit of FIG. 16.

In order to reduce such through currents, it is desirable to additionally provide NMOSFET 109 and 110 at the paths where through currents flow, as shown in FIG. 18. Here, PMOSFET 101 and NMOSFET 109 form a CMOS inverter. PMOSFET 103 and NMOSFET 110 form a CMOS inverter. Therefore, when the potential of node J is driven to an L level to turn on PMOSFET 101, NMOSFET 109 is turned off. As a result, no through current will flow even if NMOSFET 107 is turned on. Similarly, when the potential of node L is driven to an L level to cause PMOSFET 103 to be turned on, NMOSFET 110 is turned off. As a result, no through current flows even if NMOSFET 105 is turned on.

Figure 19:
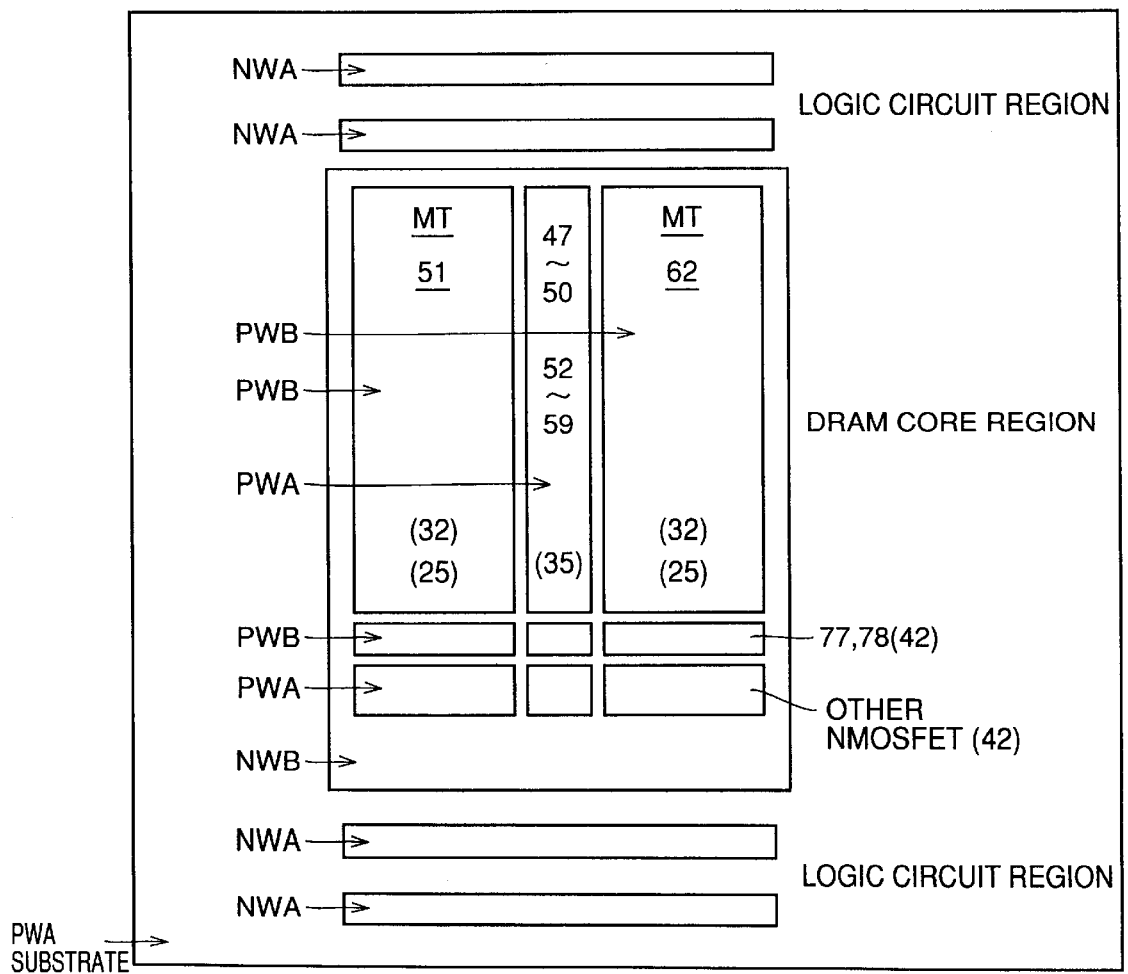
FIG. 19 is a plan view showing the well arrangement of the semiconductor memory device of FIG. 4A.

FIG. 19 shows the arrangement of each structural element of the above semiconductor memory device on a well.

The semiconductor memory device of the present embodiment is formed on a P type single crystalline silicon substrate or a P type well region (P type substrate region PWA). The logic circuit constituted by DRAM control circuit 39, main amplifier I/O system 38, Vbb generation circuit 40, Vblp generation circuit 41, as well as an address buffer, a clock circuit, and the like is formed at an N type well region NWA and a P type substrate region PWA. The DRAM core constituted by cell block 32, sense amplifier band 35, row decoder 42 and column decoder 34 is formed at an N type well region NWB deeper than N type well region NWA. By setting N type well region NWB where the DRAM core is formed deeper than N type well region NWA where the logic circuit is formed, isolation is established therebetween to prevent the noise from the logic circuit region from adversely affecting the DRAM core region.

In N type well region NWB, memory cell array 32 has NMOSFET 47–50 and 52–56 of normal threshold value (identical to the threshold value of the NMOSFET employed in the logic circuit region) provided in a region differing from the region of memory cell transistor MT and NMOSFET 51 and 62 having a threshold value lower than the normal level. NMOSFET 47–50 and 52–59 are formed at P type well region PWA whereas memory cell transistor MT and NMOSFET 51 and 62 are formed at P type well region PWB.

Similarly, the row decoder has NMOSFET 77 and 78 of word line driver 80 with a low threshold value provided at a different region from the other NMOSFETs. NMOSFET 77 and 78 are formed at P type well region PWB. The other NMOSFETs are formed at P type well region PWA.

Figure 20:
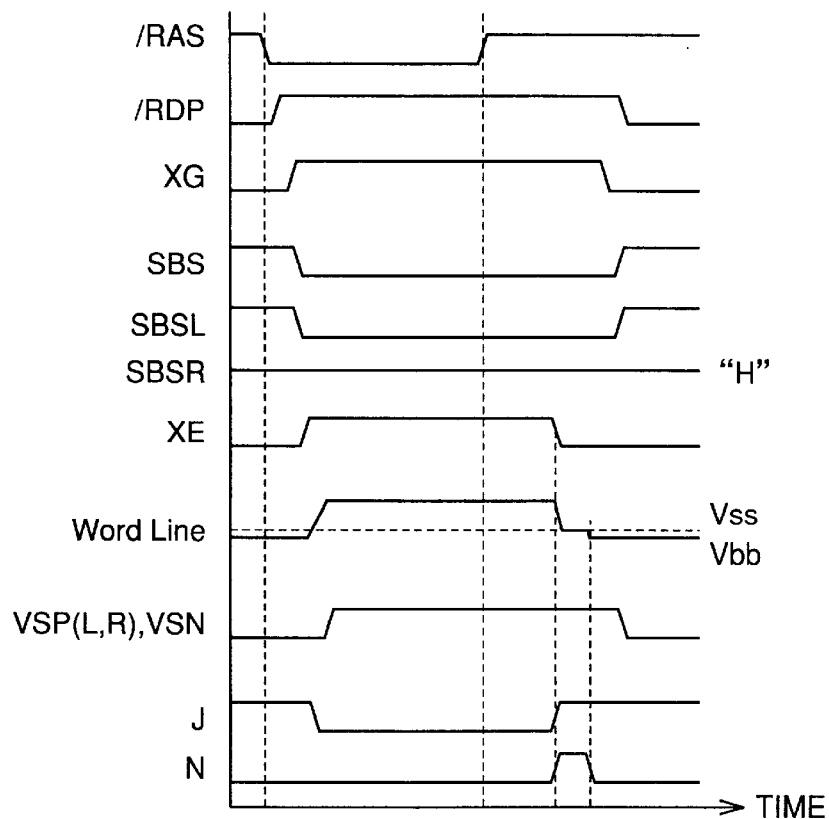
FIG. 20 is a timing chart of the semiconductor memory device of FIG. 4A.

The operation of the semiconductor memory device according to the present invention will be described hereinafter with reference to the timing chart of FIG. 20. In FIG. 20, J designates the potential of node J and N designates the potential of node N in FIG. 16.

An address signal is input in synchronization with a rise of row address strobe signal /RAS. More specifically, signal /RDP rises, and then signal XG indicating row address ascertainment rises. The potential of signal line SBS of the precharge circuit falls, and the potential of signal line SBSL falls.

In response to the rise of word line select enable signal XE under this state, the potential of node J falls, and the potential of select signal line SX1 (here, it is assumed that control circuit unit 66a is selected) is driven to the level of power supply voltage Vcc from negative voltage Vbb of a non selected state.

In response, the level of word line 21 rises to power supply voltage Vcc from negative voltage Vbb. Accordingly, there is a change in the small voltage corresponding to the stored charge of the selected memory cell at one of bit lines 15 forming a pair. The rise of the potential of signal line VSP renders sense amplifier 25Pa active, whereby the potential change in the bit line is amplified and provided to input/output line SubI/O.

Upon completion of the selection of word line 21, signal XE falls, and the potential of word line 21 (select signal line SX1) falls. In control circuit unit 66a, a one shot pulse is generated at node N in response to the fall of signal XE. The potential of word line 21 is temporarily held at the level of ground voltage Vss when this one shot pulse is at a high level (power supply voltage Vcc). Then, the voltage of word line 21 falls down to the level of negative voltage Vbb in response to the fall of the one shot pulse. Thus, the read out operation of the semiconductor memory device ends.

Figure 21A:
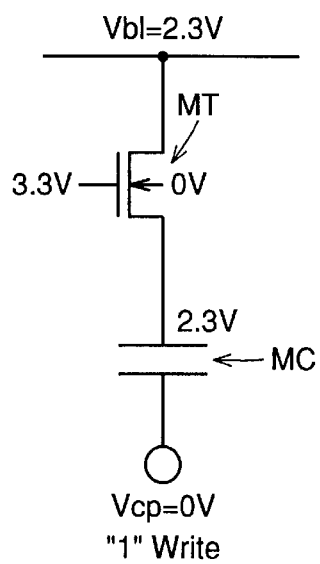
FIGS. 21A–21C are circuit diagrams showing the potential status of the memory cell shown in FIG. 10.
Figure 21B:
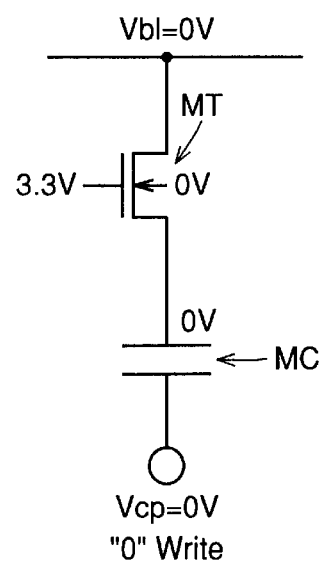
Figure 21C:
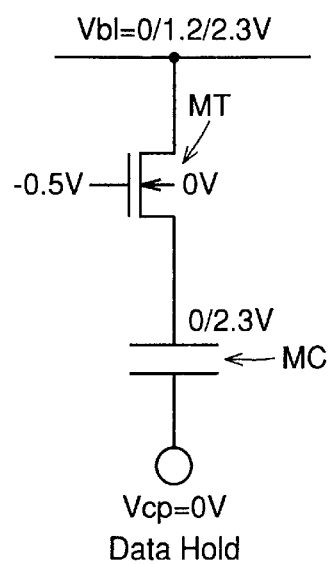

FIGS. 21A–21C show the potential status of the memory cell in the present embodiment. In the drawing, cell plate voltage Vcp and the voltage of P type well region PWB where memory cell transistor MT is formed are both set to the level of ground voltage Vss.

FIG. 21A shows the write state of an H level (1). The gate voltage connected to word line 21 is set to 3.3 V, whereby the H level (2.3 V) of the bit line is written into capacitor MC.

FIG. 21B shows the write state of an L level (0). The gate voltage connected to word line 21 is set to 3.3 V, whereby the L level (0 V) of the bit line is written into memory cell capacitor MC.

FIG. 21C shows a data retaining state. The gate voltage connected to word line 21 is set to −0.5 V which is the nonselected level. Here, the bit line is set to the H level/L level of 0 V and 2.3 V in the write/readout state. In a standby state, the bit line is at the level of high precharge voltage 1.2 V. The retain voltage of memory cell capacitor MC is 0 V or 2.3 V. The source of NMOSFET 79 for address selection is at the level of negative voltage Vbb as described above. Therefore, a reverse bias voltage (−0.5 V) is applied even when the voltage on the bit line or the retain voltage is 0 V. As a result, leakage current that reduces the stored charge will not flow.

The advantages of the semiconductor memory device of the present embodiment will be recited hereinafter.

(1) A threshold value lower than the normal one is employed for memory cell transistor MT. Therefore, the second term of equation ① becomes smaller to allow increase of the storage capacity.

(2) In the present embodiment, cell plate voltage Vcc is set to 0 V as shown in FIGS. 21A–21C. This is allowed because the capacitor insulating film of memory cell capacitor MC and the gate insulating film of the transistor that forms the logic circuit are of the same thickness. Accordingly, there is no problem even if a power supply voltage similar to that of the logic circuit region is applied to memory cell capacitor MC since the withstand voltage of the capacitor insulating film is ensured according to the TDDB characteristics. The circuit operation can be stabilized by employing ground voltage Vss which is a stable voltage among the various power supply voltages as cell plate voltage Vcp. A circuit to generate cell plate voltage Vcp is not particularly required. Therefore, the area and cost of the circuitry can be reduced.

(3) In the present embodiment, the potential of P type well region PWB where memory cell transistor MT is formed is set to 0 V (ground voltage Vss), as shown in FIGS. 21A–21C. Therefore, the back gate effect at memory cell transistor MT can be removed. The second term of equation ① is reduced to allow increase of the storage capacity.

(4) In row decoder 42, supply line LA to logic circuit 69 is formed of wiring of a different group from supply line LB to drive circuit 80. Therefore, word line 21 become relatively impervious to noise, so that writing and reading of high accuracy can be carried out.

(5) The threshold value of the two stages of NMOSFET 77 and 78 of drive circuit 80 are set to a low value equal to that of memory cell transistor MT. Therefore, the rising speed of word line 21 is increased to allow the write and read operations to be carried out more speedily.

(6) In order to maintain favorable TDDB characteristics to implement a design of high reliability and reduce the consumed current, it is desirable that a high voltage is not applied between bit line 15 and word line 21. When word line 21 of a non selected state is held at the level of negative voltage Vbb as in the present embodiment, it is desirable that direct application of power supply voltage Vcc to the bit line is avoided.

In the present embodiment, N channel MOSFET 51 is employed as the switching element to apply power supply voltage Vcc to sense amplifier 25Pa (and in turn, the bit line) from power supply line 36. Therefore, a voltage lower than power supply voltage Vcc by threshold voltage Vtn of NMOSFET 51 can be applied to one pair of bit lines 15 (sense amplifier 25Pa) in comparison to the case where a P channel MOSFET is employed as the switching element. Reliability of circuitry can be improved and power consumption reduced.

Also, the parasitic capacitance generated at sense amplifier 25Pa (PMOSFET 45, 46) becomes smaller than that where a P channel MOSFET is employed as the switching element. Therefore, the operation of sense amplifier 25Pa can be carried out more speedily.

(7) Switching transistors 49 and 50 to connect a bit line pair to a common bit line pair are arranged opposite to sub array 32a with respect to PMOSFET 45 and 46 of sense amplifier 25Pa. Therefore, switching transistors 49 and 50 of a threshold value identical to that of the NMOSFET employed in the logic circuit region, not the low threshold value of memory cell transistor MT, can be employed. For example, if switching transistors 49 and 50 of low threshold values are used, negative voltage Vbb must be used as the voltage to reliably turn off switching transistors 49 and 50. In the present embodiment, 0 V (ground voltage Vss) can be used as the voltage to reliably turn off switching transistors 49 and 50. This provides the following advantages.

(a) The operating range of switching transistors 49 and 50 corresponds to ground voltage Vss (0 V)—power supply voltage Vcc, not negative voltage Vbb—power supply voltage Vcc as word line 21. Therefore, circuitry similar to the word line drive circuit and the layout area therefor are no longer required. As a result, the area can be reduced.

(b) It is no longer necessary to improve the capability of Vbb generation circuit 40. The layout area required for Vbb generation circuit 40 can be reduced. Also, the consumed current can be reduced.

(8) By arranging power supply line 36 and ground line 37 on memory cell array 33 with an insulating film thereunder, the power supply and ground lines can be formed at a layer different from that of memory cell array 33. Therefore, the problem of voltage drop of the power supply occurring during sense amplifier activation and the noise components such as bounding of ground voltage can be eliminated. As a result, the values of α and γ of equation ①  can be made to approximate 1. The storage capacity can be increased. Also, any particular measurement for enhancing the power supply is not required. Therefore, the circuit complexity can be reduced.

(9) When word line 21 of a non selected state is clamped at negative voltage Vbb as in the present embodiment, the charge generated when activated word line 21 is rendered inactive flows to the node of negative voltage Vbb and passes through NMOSFET 79 into word line 21. As a result, the gate potential of memory cell transistor MT connected to word line 21 rises to cause leakage of the stored charge. There was a problem that the data retaining property is deteriorated. In the present embodiment, the potential of word line 21 (select signal line SX1) is reduced, not directly to the Vbb level, but first to the level of ground voltage Vss (0 V) by control circuit unit 66a in response to the fall of signal XE, and then down to the level of negative voltage Vbb. Most of the charge stored in word line 21 flows to the ground potential during this period where the potential of select signal line SX1 is temporarily held at the level of ground voltage Vss. Even if charge is newly generated thereafter at the reduced level of negative voltage Vbb, the total amount of charge is so small that the rise of the gate potential of memory cell transistor MT connected to word line 21 is suppressed. As a result, degradation of the data retaining characteristics caused by leakage of stored charge can be prevented.

According to the semiconductor memory device of the present invention, a field effect transistor for use with switching in order to connect the bit line extending from the memory cell array to a sense amplifier can be reliably turned on/off within a small operating range. Therefore, the capability or complexity of the drive circuit can be reduced to allow the area to be saved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a first common bit line, a second common bit line complementary to said first common bit line, an N channel sense amplifier connected between said first and second common bit lines, a first bit line, a second bit line complementary to said first bit line, a first P channel sense amplifier connected between said first and second bit lines, a first switching transistor connected between said first common bit line and said first bit line, a second switching transistor connected between said second common bit line and said second bit line, a third bit line, a fourth bit line complementary to said third bit line, a second P channel sense amplifier connected between said third and fourth bit lines, a third switching transistor connected between said first common bit line and said third bit line, a fourth switching transistor connected between said second common bit line and said fourth bit line, a word line, a memory cell capacitor, a memory cell transistor connected between said first bit line and said memory cell capacitor, having a gate connected to said word line; and an N channel drive transistor connected between a power supply node and said first P channel sense amplifier;

wherein said N channel drive transistor has a threshold value lower than the threshold value of said first switching transistor.

2. The semiconductor memory device according to claim 1, further comprising a control circuit selectively applying a power supply voltage and a ground voltage to a gate of said N channel driver transistor.

3. A semiconductor memory device comprising:

a first common bit line, a second common bit line complementary to said first common bit line, an N channel sense amplifier connected between said first and second common bit lines, a first bit line, a second bit line complementary to said first bit line, a first P channel sense amplifier connected between said first and second bit lines, a first switching transistor connected between said first common bit line and said first bit line, a second switching transistor connected between said second common bit line and said second bit line, a third bit line, a fourth bit line complementary to said third bit line, a second P channel sense amplifier connected between said third and fourth bit lines, a third switching transistor connected between said first common bit line and said third bit line, a fourth switching transistor connected between said second common bit line and said fourth bit line, a word line, a memory cell capacitor, a memory cell transistor connected between said first bit line and said memory cell capacitor, having a gate connected to said word line; and an N channel drive transistor connected between a power supply node and said first P channel sense amplifier;

wherein said N channel drive transistor has a threshold value substantially equal to the threshold value of said memory cell transistor.

* * * * *